United States Patent
Yamazaki et al.

(10) Patent No.: US 9,502,690 B2
(45) Date of Patent: Nov. 22, 2016

(54) ORGANIC LIGHT-EMITTING DEVICE AND LIGHTING DEVICE WITH ORGANIC RESIN AND GLASS SUBSTRATE

(75) Inventors: Shunpei Yamazaki, Tokyo (JP); Koichiro Tanaka, Kanagawa (JP); Masaaki Hiroki, Kanagawa (JP); Hisao Ikeda, Kanagawa (JP); Kengo Akimoto, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 1012 days.

(21) Appl. No.: 13/327,047

(22) Filed: Dec. 15, 2011

(65) Prior Publication Data
US 2012/0153333 A1 Jun. 21, 2012

(30) Foreign Application Priority Data
Dec. 16, 2010 (JP) ................. 2010-280652

(51) Int. Cl.
*H01L 51/52* (2006.01)
*H01L 51/50* (2006.01)

(52) U.S. Cl.
CPC ........... *H01L 51/5275* (2013.01); *H01L 51/50* (2013.01); *H01L 51/524* (2013.01);
(Continued)

(58) Field of Classification Search
CPC .............. H01L 51/50; H01L 51/5212; H01L 51/5237; H01L 51/524; H01L 51/5246; H01L 51/525; H01L 51/5253; H01L 51/5256; H01L 51/5259; H01L 51/5275; H01L 2251/53; H01L 2251/50; H01L 2251/5307; H01L 2251/5338; H01L 2251/5323; H01L 2251/5361

USPC ............. 257/40, 98, 99, E33.062, E33.073
See application file for complete search history.

(56) References Cited

U.S. PATENT DOCUMENTS

| 5,107,175 A | 4/1992 | Hirano et al. |
| 5,124,204 A | 6/1992 | Yamashita et al. |

(Continued)

FOREIGN PATENT DOCUMENTS

| EP | 1 814 179 A2 | 8/2007 |
| EP | 1 848 050 A2 | 10/2007 |

(Continued)

OTHER PUBLICATIONS

Kim, G.H. et al, "Thin Film Passivation for Longevity of Organic Light-Emitting Devices and Organic Thin-Film Transistor," IDW '03: Proceedings of the 10th International Display Workshops, Dec. 3-5, 2003, pp. 387-390.

(Continued)

*Primary Examiner* — John P Dulka
(74) *Attorney, Agent, or Firm* — Husch Blackwell LLP

(57) ABSTRACT

A highly reliable light-emitting device which includes an organic EL element and is lightweight is provided. The light-emitting device includes a first organic resin layer; a first glass layer over the first organic resin layer; a light-emitting element over the first glass layer; a second glass layer over the light-emitting element; and a second organic resin layer over the second glass layer. The first organic resin layer and the first glass layer each have a property of transmitting visible light. The light-emitting element includes a first electrode having a property of transmitting visible light, a layer containing a light-emitting organic compound, and a second electrode stacked in this order from the first glass layer side.

31 Claims, 19 Drawing Sheets

(52) U.S. Cl.
CPC ......... *H01L51/525* (2013.01); *H01L 51/5212* (2013.01); *H01L 51/5237* (2013.01); *H01L 51/5246* (2013.01); *H01L 51/5253* (2013.01); *H01L 51/5256* (2013.01); *H01L 51/5259* (2013.01); *H01L 2251/50* (2013.01); *H01L 2251/53* (2013.01); *H01L 2251/5307* (2013.01); *H01L 2251/5323* (2013.01); *H01L 2251/5338* (2013.01); *H01L 2251/5361* (2013.01)

(56) References Cited

U.S. PATENT DOCUMENTS

| | | | |
|---|---|---|---|
| 5,189,405 | A | 2/1993 | Yamashita et al. |
| 5,686,360 | A | 11/1997 | Harvey, III et al. |
| 5,693,956 | A | 12/1997 | Shi et al. |
| 5,757,126 | A | 5/1998 | Harvey, III et al. |
| 5,771,562 | A | 6/1998 | Harvey, III et al. |
| 5,811,177 | A | 9/1998 | Shi et al. |
| 5,952,778 | A | 9/1999 | Haskal et al. |
| 6,146,225 | A | 11/2000 | Sheats et al. |
| 6,150,187 | A | 11/2000 | Zyung et al. |
| 6,198,217 | B1 | 3/2001 | Suzuki et al. |
| 6,198,220 | B1 | 3/2001 | Jones et al. |
| 6,268,695 | B1 | 7/2001 | Affinito |
| 6,413,645 | B1 | 7/2002 | Graff et al. |
| 6,771,021 | B2 * | 8/2004 | Cok ............................ 313/512 |
| 6,965,195 | B2 | 11/2005 | Yamazaki et al. |
| 7,112,115 | B1 | 9/2006 | Yamazaki et al. |
| 7,663,312 | B2 | 2/2010 | Anandan |
| 7,755,097 | B2 | 7/2010 | Kim |
| 7,909,483 | B2 | 3/2011 | Jacobs et al. |
| 7,944,144 | B2 | 5/2011 | Gomi |
| 7,957,621 | B2 | 6/2011 | Zhang et al. |
| 7,977,876 | B2 | 7/2011 | Yamazaki et al. |
| 7,999,372 | B2 | 8/2011 | Park |
| 8,003,993 | B2 | 8/2011 | Cho et al. |
| 8,004,003 | B2 | 8/2011 | Kim |
| 8,249,409 | B2 | 8/2012 | Zhang et al. |
| 8,760,046 | B2 | 6/2014 | Seo et al. |
| 9,006,965 | B2 | 4/2015 | Seo et al. |
| 2001/0035713 | A1 | 11/2001 | Kimura |
| 2004/0217702 | A1 * | 11/2004 | Garner et al. ............... 313/512 |
| 2005/0199599 | A1 | 9/2005 | Li et al. |
| 2006/0237735 | A1 | 10/2006 | Naulin et al. |
| 2007/0222372 | A1 | 9/2007 | Cok et al. |
| 2007/0254162 | A1 | 11/2007 | Kozaki et al. |
| 2008/0018231 | A1 | 1/2008 | Hirakata |
| 2008/0121918 | A1 | 5/2008 | DenBaars et al. |
| 2008/0213931 | A1 | 9/2008 | Asabe |
| 2010/0013372 | A1 | 1/2010 | Oikawa et al. |
| 2010/0090234 | A1 | 4/2010 | Cho et al. |
| 2010/0110551 | A1 | 5/2010 | Lamansky et al. |
| 2010/0295443 | A1 | 11/2010 | Roberts et al. |
| 2011/0114954 | A1 * | 5/2011 | Lee et al. ..................... 257/59 |
| 2011/0147777 | A1 | 6/2011 | Konno et al. |
| 2012/0146489 | A1 * | 6/2012 | Fischer et al. ............... 313/504 |
| 2015/0214251 | A1 | 7/2015 | Seo et al. |

FOREIGN PATENT DOCUMENTS

| | | |
|---|---|---|
| EP | 2 110 868 A1 | 10/2009 |
| JP | 7-65950 | 3/1995 |
| JP | 2001-203076 A | 7/2001 |
| JP | 2003-337549 A | 11/2003 |
| JP | 2004-022438 A | 1/2004 |
| JP | 2006-100042 A | 4/2006 |
| JP | 2006-196466 A | 7/2006 |
| JP | 2006-294491 A | 10/2006 |
| JP | 2007-287486 A | 11/2007 |
| JP | 2008-112592 A | 5/2008 |
| JP | 2009-146654 A | 7/2009 |
| JP | 2009-289615 A | 12/2009 |
| JP | 2010-129184 A | 6/2010 |
| JP | 2012-512518 | 5/2012 |
| TW | 200739989 | 10/2007 |
| TW | 200817630 | 4/2008 |
| TW | 201004463 | 1/2010 |
| TW | 201018307 | 5/2010 |
| WO | WO 2008/012702 A1 | 1/2008 |
| WO | WO 2010/004944 A1 | 1/2010 |
| WO | WO 2010/077521 A2 | 7/2010 |

OTHER PUBLICATIONS

Taiwanese Office Action re Application No. TW 100146102, dated Jan. 7, 2016.
Taiwanese Office Action re Application No. TW 100146102, dated May 19, 2016.

* cited by examiner

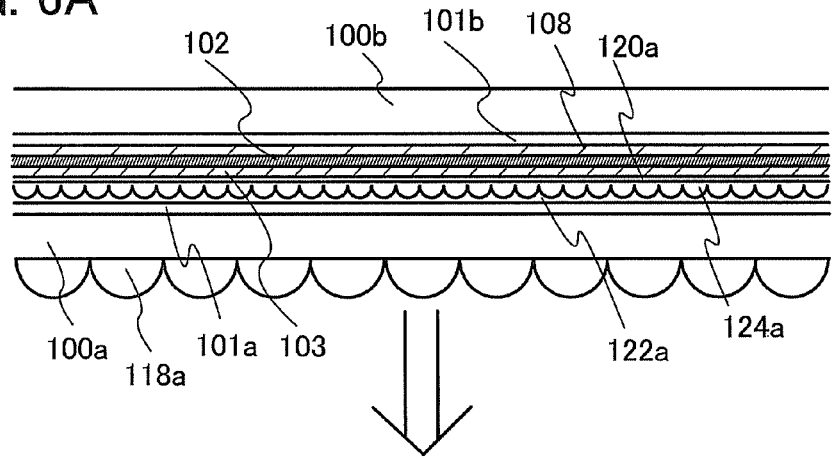
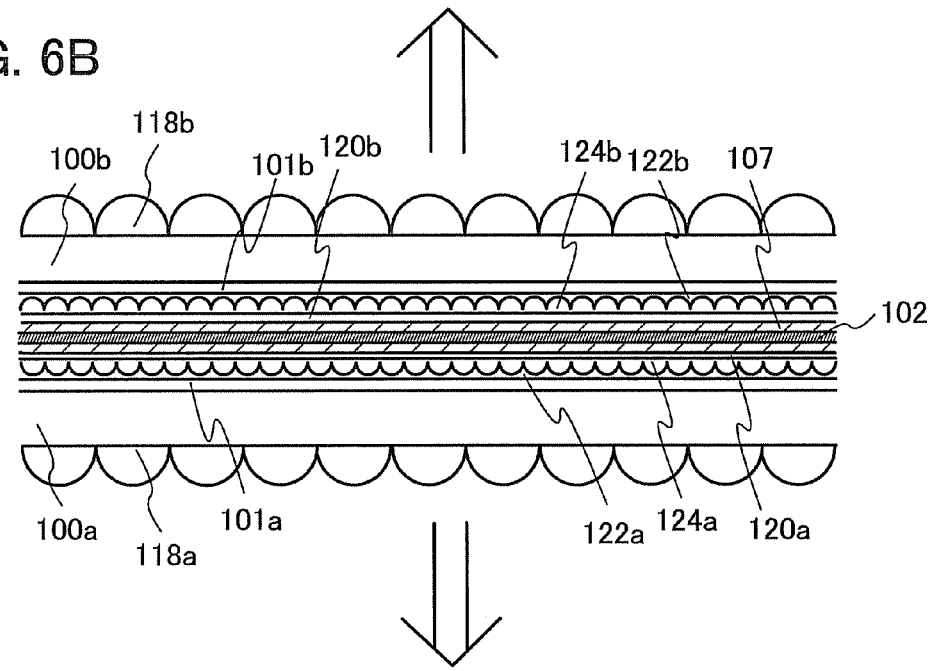

ORGANIC LIGHT-EMITTING DEVICE AND LIGHTING DEVICE WITH ORGANIC RESIN AND GLASS SUBSTRATE

BACKGROUND OF THE INVENTION

1. Field of the Invention

The present invention relates to a light-emitting device utilizing organic electroluminescence (EL). The present invention also relates to a lighting device including the light-emitting device.

2. Description of the Related Art

Research and development have been extensively conducted on an element utilizing an organic electroluminescence phenomenon (also referred to as an organic EL element). In the fundamental structure of the organic EL element, a layer containing a light-emitting organic compound is sandwiched between a pair of electrodes. By applying voltage to this element, light emission from the light-emitting organic compound can be obtained.

The organic EL element can be formed into a film form and thus a large-area element can easily be formed. Therefore, utility value of the organic EL element as a surface light source that can be applied to lighting or the like is also high.

For example, a light-emitting device in which an organic EL element is provided over a plastic substrate is disclosed in Non-Patent Document 1. A light-emitting device including a plastic substrate can be made lightweight compared to the one including a glass substrate or the like.

REFERENCE

Non-Patent Document

[Non-Patent Document 1] Gi Heon Kim et al., "THIN FILM PASSIVATION FOR LONGEVITY OF ORGANIC LIGHT-EMITTING DEVICES AND ORGANIC THIN-FILM TRANSISTOR", IDW'03, 2003, pp. 387-390

SUMMARY OF THE INVENTION

An organic EL element has a problem in that the reliability is lowered owing to entry of moisture, oxygen, an impurity, or the like.

When moisture, oxygen, or an impurity enters an organic compound or a metal material included in an organic EL element from the outside of the organic EL element, the lifetime of the organic EL element is drastically shortened in some cases. This is because an organic compound or a metal material included in the organic EL element reacts with moisture, oxygen, or an impurity; thus, the organic EL element deteriorates.

A plastic substrate such as that used in Non-Patent Document 1 easily transmits moisture, oxygen, an impurity, or the like. Therefore, entry of moisture, oxygen, an impurity, or the like from the side where the plastic substrate is used adversely affects the lifetime of the organic EL element and the light-emitting device in some cases.

In view of the above, an object of one embodiment of the present invention is to provide a highly reliable light-emitting device which includes an organic EL element and is lightweight.

The present inventors have focused on the use of a substrate in which an organic resin layer and a thin glass layer are attached to each other as a substrate of a light-emitting device.

Specifically, one embodiment of the present invention is a light-emitting device including a first organic resin layer; a first glass layer over the first organic resin layer and in contact with a surface of the first organic resin layer; a light-emitting element over the first glass layer; a second glass layer over the light-emitting element; and a second organic resin layer over the second glass layer and in contact with a surface of the second glass layer. The first organic resin layer and the first glass layer each have a property of transmitting visible light. The thickness of the first glass layer and the thickness of the second glass layer are independently greater than or equal to 25 µm and less than or equal to 100 µm. The light-emitting element includes a first electrode having a property of transmitting visible light, a layer containing a light-emitting organic compound, and a second electrode stacked in this order from the first glass layer side.

According to one embodiment of the present invention, a light-emitting device can be made lightweight. Further, entry of moisture, oxygen, an impurity, or the like into an organic compound or a metal material included in a light-emitting element from the outside of the light-emitting device can be suppressed.

In the above light-emitting device, the first organic resin layer and the second organic resin layer are preferably formed of the same material. When the first organic resin layer and the second organic resin layer are formed of the same material, a defect in shape due to thermal strain or physical impact can be suppressed. Therefore, deformation of or damage to the light-emitting device in manufacture or use thereof can be suppressed.

In the above light-emitting device, a sealing layer which is in contact with the first glass layer and covers the light-emitting element is preferably provided. By providing the sealing layer, entry of moisture, oxygen, an impurity, or the like into an organic compound or a metal material included in the light-emitting element from the outside of the light-emitting element can be further suppressed.

A light-emitting device including an organic EL element emits light in a region where its refractive index is higher than that of the air. Therefore, when light is extracted to the air, total reflection occurs inside the light-emitting device or at the boundary between the light-emitting device and the air under a certain condition. Accordingly, the light extraction efficiency of the light-emitting device is lower than 100%. It is said that the light extraction efficiency of a light-emitting device is approximately 20% to 30%.

For example, when light enters a medium B having a low refractive index from a medium A having a high refractive index, total reflection occurs in some cases depending on the incidence angle.

At this time, it is preferable that an uneven structure be provided at the interface between the medium A and the medium B. With such a structure, a phenomenon can be suppressed, phenomenon in which light entering the medium B from the medium A at an incidence angle exceeding a critical angle is totally reflected and the wave of the light propagates inside the light-emitting device to lower the light extraction efficiency.

The light extraction efficiency of a light-emitting device according to one embodiment of the present invention described below can be approximately 1.2 to 2 times as high as that of a light-emitting device to which one embodiment of the present invention is not applied.

In the above light-emitting device, another surface of the first organic resin layer that is not in contact with the first glass layer is preferably provided with an uneven structure.

The refractive index of the first organic resin layer is higher than that of the air, so that total reflection occurs at the interface between the first organic resin layer and the air in some cases. When the uneven structure is provided at the interface between the air and the first organic resin layer, the proportion of light that cannot be extracted to the air owing to total reflection can be reduced, and the light extraction efficiency of the light-emitting device can be improved.

In general, the refractive index of glass is approximately 1.5, which is lower than that of the layer containing a light-emitting organic compound (e.g., 1.6 or higher). Accordingly, when light enters the first glass layer from the first electrode, total reflection occurs in some cases. Therefore, an uneven structure is preferably provided at the interface between the first electrode and the first glass layer.

However, in the organic EL element, when the first electrode is uneven, leakage current might be generated in the layer containing a light-emitting organic compound or the like formed over the first electrode.

Therefore, in the above light-emitting device, an uneven structure body over the first glass layer, a first resin layer over the uneven structure body, and the first electrode over the first resin layer are preferably provided, and the refractive index of the first resin layer is preferably higher than or equal to that of the layer containing a light-emitting organic compound. Also, in the above light-emitting device, an uneven structure body over the first glass layer, a first resin layer over the uneven structure body, and the first electrode over the first resin layer are preferably provided, and the refractive index of the first resin layer is preferably higher than or equal to that of the first electrode.

With such a structure, it is not necessary to provide an uneven structure for suppressing a decrease in light extraction efficiency at the interface between the first resin layer and the first electrode; thus, the first electrode can be flat, which can suppress generation of leakage current in the layer containing a light-emitting organic compound or the like caused by unevenness of the first electrode.

Since the uneven structure body is provided between the first resin layer and the first glass layer, the proportion of light which cannot be extracted to the air owing to total reflection can be reduced and the light extraction efficiency of the light-emitting device can be improved.

In the above light-emitting device, a first protective layer is preferably provided between and in contact with the first resin layer and the first electrode, and the refractive index of the first protective layer is preferably higher than or equal to that of the first resin layer. By providing the protective layer, entry of moisture or an impurity into the light-emitting element from the first resin layer can be suppressed.

The above light-emitting device according to one embodiment of the present invention has a bottom emission structure in which light emission is extracted through a surface on the substrate side provided with a light-emitting element, or a top emission structure in which light emission is extracted through a surface on the opposite side of the substrate provided with a light-emitting element. One embodiment of the present invention can also be applied to a dual emission structure in which light emission is extracted through both of the above surfaces.

In the above light-emitting device, the second organic resin layer, the second glass layer, and the second electrode each preferably have a property of transmitting visible light. With such a structure, a light-emitting device having a dual emission structure can be realized.

In the above light-emitting device, another surface of the second organic resin layer that is not in contact with the second glass layer is preferably provided with an uneven structure. The refractive index of the second organic resin layer is higher than that of the air, so that total reflection occurs at the interface between the second organic resin layer and the air in some cases. When the uneven structure is provided at the interface between the air and the second organic resin layer, the proportion of light which cannot be extracted to the air owing to total reflection can be reduced, and the light extraction efficiency of the light-emitting device can be improved.

In the above light-emitting device, a second resin layer over the second electrode, an uneven structure body over the second resin layer, and the second glass layer over the uneven structure body are preferably provided, and the refractive index of the second resin layer is preferably higher than or equal to that of the layer containing a light-emitting organic compound.

Alternatively, in the above light-emitting device, a second resin layer over the second electrode, an uneven structure body over the second resin layer, and the second glass layer over the uneven structure are preferably provided, and the refractive index of the second resin layer is preferably higher than or equal to that of the second electrode.

With such a structure, it is not necessary to provide an uneven structure for suppressing a decrease in light extraction efficiency at the interface between the second resin layer and the second electrode; thus, the second electrode can be flat, which can suppress generation of leakage current in the layer containing a light-emitting organic compound or the like caused by unevenness of the second electrode.

Total reflection occurs at the interface between the second resin layer and the second glass layer in some cases. However, the uneven structure body is provided at the interface between the second resin layer and the second glass layer in the above light-emitting device, whereby the proportion of light which cannot be extracted to the air owing to total reflection can be reduced and the light extraction efficiency of the light-emitting device can be improved.

In the above light-emitting device, a second protective layer is preferably provided between and in contact with the second electrode and the second resin layer, and the refractive index of the second protective layer is preferably higher than or equal to that of the second resin layer. By providing the protective layer, entry of moisture or an impurity into the light-emitting element from the second resin layer can be suppressed.

The above light-emitting device preferably has flexibility. For example, when the glass layers in the above light-emitting device each have a thickness greater than or equal to 25 μm and less than or equal to 75 μm, the light-emitting device can be made lightweight and have high resistance to bending and breaking.

Another embodiment of the present invention is the light-emitting device including a converter. According to one embodiment of the present invention, a converter can be incorporated in a light-emitting device without changing the thickness of the light-emitting device.

Another embodiment of the present invention is a lighting device including the light-emitting device in a light-emitting portion.

According to one embodiment of the present invention, a highly reliable light-emitting device which includes an organic EL element and is lightweight can be provided.

BRIEF DESCRIPTION OF THE DRAWINGS

FIGS. 6A and 6B are cross-sectional views each illustrating a light-emitting device according to one embodiment of the present invention.

DETAILED DESCRIPTION OF THE INVENTION

Figure 1:
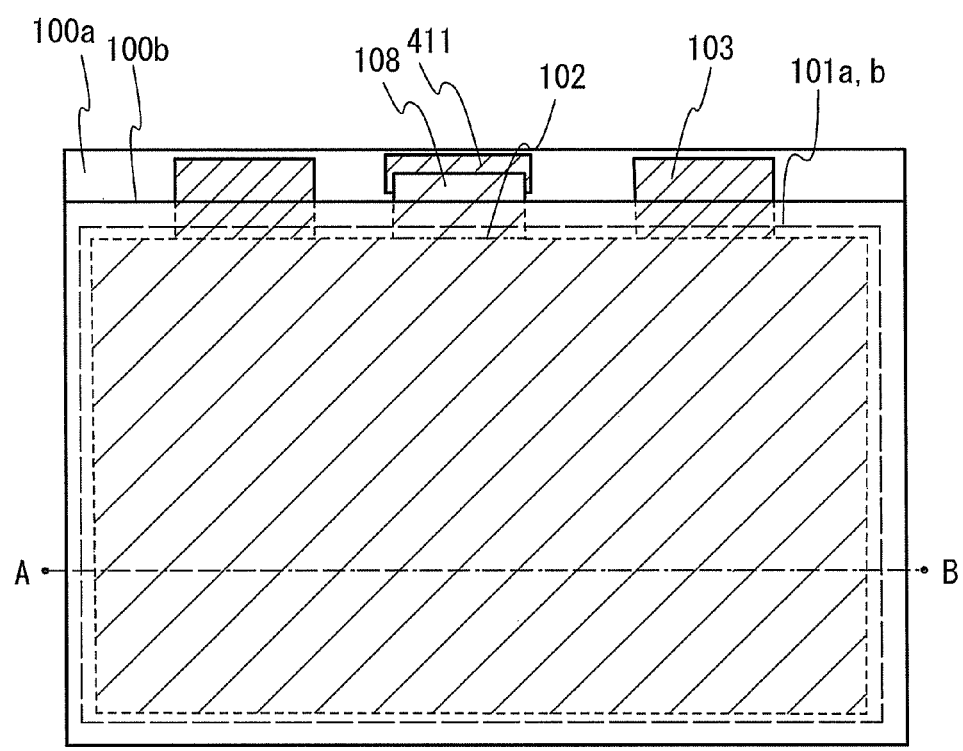
FIG. 1 is a plan view of a light-emitting device according to one embodiment of the present invention.

Embodiments of the present invention will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. In the structures described below, the same portions or portions having similar functions are denoted by the same reference numerals in different drawings, and explanation thereof will not be repeated.

Note that in this embodiment, a first electrode functions as an anode, and a second electrode functions as a cathode.

However, the present invention is not limited to this, and a first electrode functioning as a cathode and a second electrode functioning as an anode may be provided.

Embodiment 1

In this embodiment, a light-emitting device according to one embodiment of the present invention will be described with reference to FIG. 1, FIGS. 2A to 2C, FIG. 3, FIG. 4, and FIGS. 5A and 5B.

FIG. 1 is a plan view of a light-emitting device according to one embodiment of the present invention. Note that in FIG. 1, some components (e.g., a sealant 114 in FIG. 2A and the like) are not illustrated.

In FIG. 1, a first glass layer 101a is formed over a first organic resin layer 100a, and a light-emitting element (a first electrode 103, an EL layer 102, and a second electrode 108) is formed over the first glass layer 101a. In addition, a second glass layer 101b is formed over the light-emitting element, and a second organic resin layer 100b is formed over the second glass layer 101b.

The second electrode 108 is connected to a connection electrode 411. The connection electrode 411 can be formed using a material similar to that of the first electrode 103.

Further, a light-emitting element according to one embodiment of the present invention may be provided with a converter. In Embodiment 7, a light-emitting element provided with a converter will be described in detail.

Structural Example 1

Figure 2A:
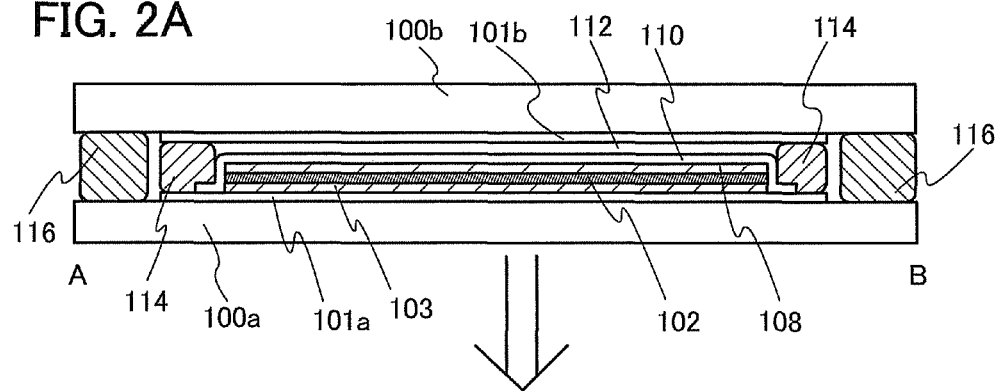
FIGS. 2A to 2C are cross-sectional views each illustrating a light-emitting device according to one embodiment of the present invention.

FIG. 2A illustrates one example of a light-emitting device having a bottom emission structure. FIG. 2A is a cross-sectional view taken along line A-B in FIG. 1.

The light-emitting device illustrated in FIG. 2A includes the first organic resin layer 100a, the first glass layer 101a, the light-emitting element (the first electrode 103, the EL layer 102, and the second electrode 108), a sealing layer 110, the second glass layer 101b, and the second organic resin layer 100b.

Since Structural Example 1 has a bottom emission structure, the first electrode 103 has a property of transmitting visible light (hereinafter, referred to as a light-transmitting property).

In FIG. 2A, the first glass layer 101a and the second glass layer 101b are attached to each other with the sealant 114. The light-emitting device illustrated in FIG. 2A has a structure in which the light-emitting element is provided in a space 112 surrounded by the first glass layer 101a, the second glass layer 101b, and the sealant 114.

Figure 2B:
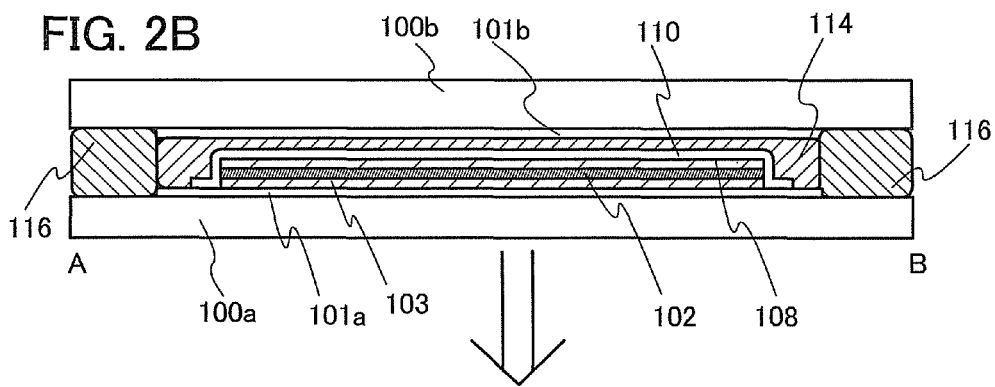
Figure 2C:
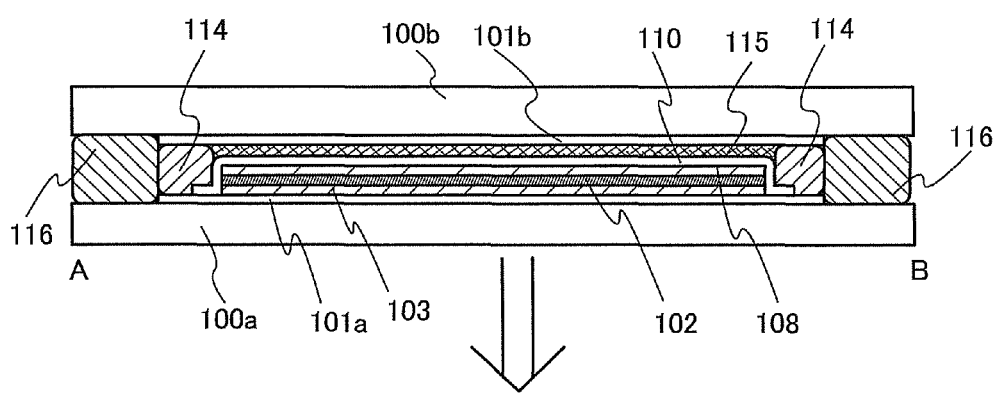

Note that the space 112 is filled with an inert gas (such as nitrogen or argon) as a filler. Alternatively, as illustrated in FIG. 2B, a structure may be employed in which the space 112 is filled with the sealant 114. Further alternatively, as illustrated in FIG. 2C, the space 112 may be filled with a filler 115 which is different from the sealant 114 and a sealant 116. A material having low viscosity among materials used as a sealant is used for the filler 115, whereby the space 112 can be easily filled.

A space may be provided between the sealant 114 and the sealant 116 (for example, FIG. 2A). Alternatively, the sealant 114 and the sealant 116 may be in contact with each other (for example, FIG. 2B).

Further, in Structural Example 1, when the second electrode 108 has a light-transmitting property instead of the first electrode 103, a light-emitting device having a top emission structure can be realized.

Structural Example 2

Figure 3:
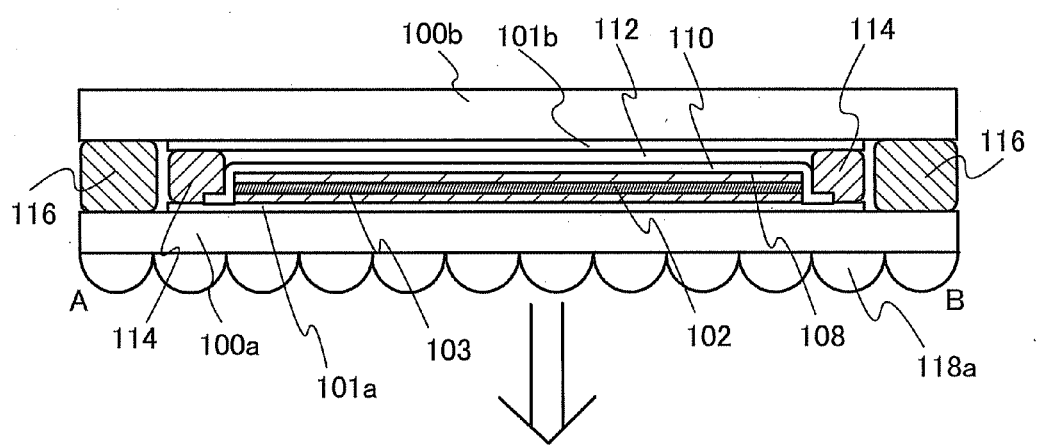
FIG. 3 is a cross-sectional view illustrating a light-emitting device according to one embodiment of the present invention.

FIG. 3 illustrates another example of a light-emitting device having a bottom emission structure. FIG. 3 is a cross-sectional view taken along line A-B in FIG. 1.

The light-emitting device illustrated in FIG. 3 includes the first organic resin layer 100a provided with an uneven structure 118a, the first glass layer 101a, the light-emitting element (the first electrode 103, the EL layer 102, and the second electrode 108), the sealing layer 110, the second glass layer 101b, and the second organic resin layer 100b.

The refractive index of the first organic resin layer 100a is higher than that of the air, so that total reflection occurs at the interface between the first organic resin layer 100a and the air in some cases. Since the uneven structure 118a is provided at the interface between the air and the first organic resin layer 100a in Structural Example 2, the proportion of light which cannot be extracted to the air owing to total reflection can be reduced, and the light extraction efficiency of the light-emitting device can be improved.

The other structures can be similar to those in Structural Example 1.

Structural Example 3

Figure 4:
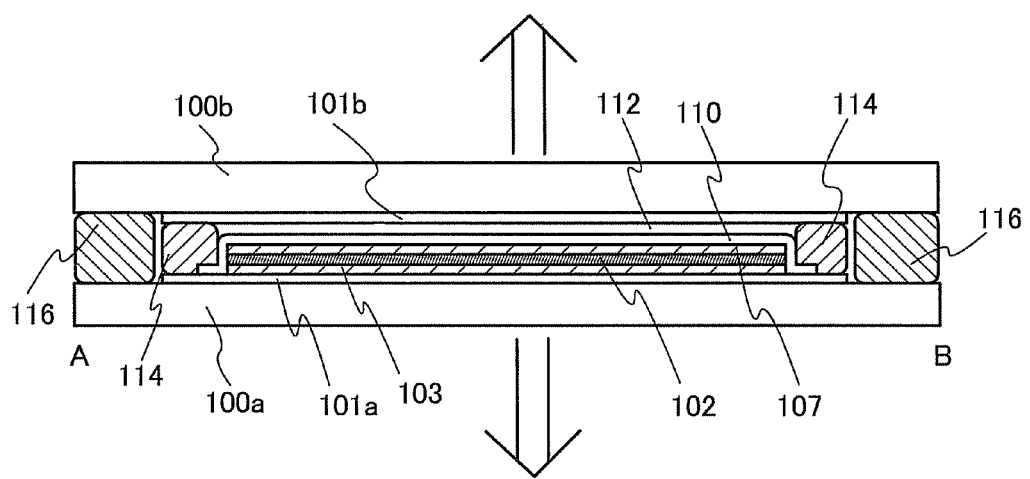
FIG. 4 is a cross-sectional view illustrating a light-emitting device according to one embodiment of the present invention.

FIG. 4 illustrates one example of a light-emitting device having a dual emission structure. FIG. 4 is a cross-sectional view taken along line A-B in FIG. 1.

The light-emitting device illustrated in FIG. 4 includes the first organic resin layer 100a, the first glass layer 101a, a light-emitting element (the first electrode 103, the EL layer 102, and a second electrode 107), the sealing layer 110, the second glass layer 101b, and the second organic resin layer 100b.

Structural Example 3 shows a light-emitting device having a dual emission structure. Therefore, in addition to the first electrode 103, the second electrode 107 has a light-transmitting property.

The other structures can be similar to those in Structural Example 1.

Structural Example 4

Figure 5A:
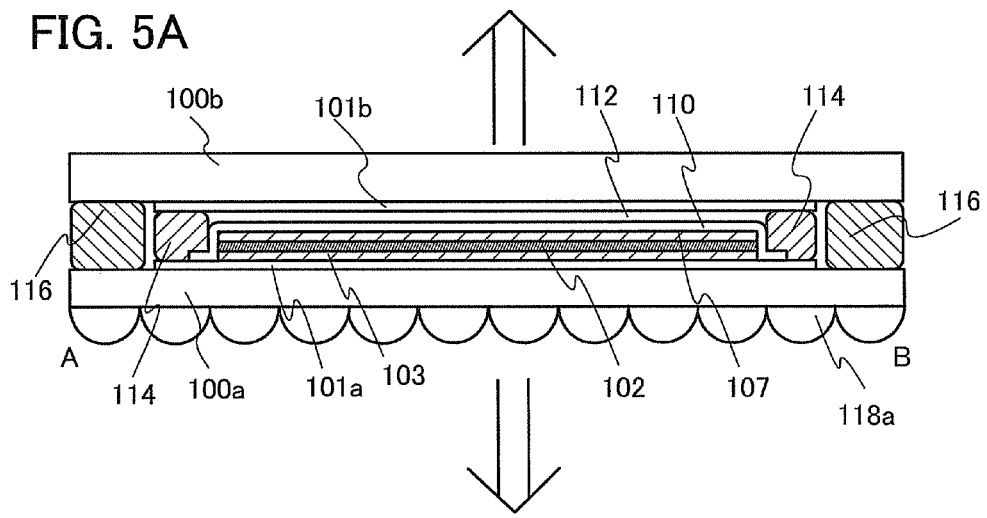
FIGS. 5A and 5B are cross-sectional views each illustrating a light-emitting device according to one embodiment of the present invention.

FIG. 5A illustrates another example of a light-emitting device having a dual emission structure. FIG. 5A is a cross-sectional view taken along line A-B in FIG. 1.

The light-emitting device illustrated in FIG. 5A includes the first organic resin layer 100a provided with the uneven structure 118a, the first glass layer 101a, the light-emitting element (the first electrode 103, the EL layer 102, and the second electrode 107), the sealing layer 110, the second glass layer 101b, and the second organic resin layer 100b.

Structural Example 4 shows a light-emitting device having a dual emission structure. Therefore, the first electrode 103 and the second electrode 107 each have a light-transmitting property.

The refractive index of the first organic resin layer 100a is higher than that of the air, so that total reflection occurs at the interface between the first organic resin layer 100a and the air in some cases. When the uneven structure 118a is provided at the interface between the air and the first organic resin layer 100a as in Structural Example 4, the proportion of light which cannot be extracted to the air owing to total reflection can be reduced, and the light extraction efficiency of the light-emitting device can be improved.

In a similar manner, a surface of the second organic resin layer 100b, which is exposed to the air, may be provided with an uneven structure.

Note that in the light-emitting device illustrated in FIG. 5A, light emitted from the EL layer 102 is extracted to the space 112 (to an inert gas) through the second electrode 107. Here, the refractive index of the second electrode 107 is higher than that of the gas filling the space 112; thus, total reflection occurs at the interface between the second electrode 107 and the space 112 in some cases. Therefore, a surface of the second electrode 107, which is in contact with the space 112, is preferably uneven. After light is extracted to the space 112 once, light that cannot be extracted to the air due to total reflection or the like is not generated; thus, an uneven structure may be provided, but is not necessarily provided.

Figure 5B:
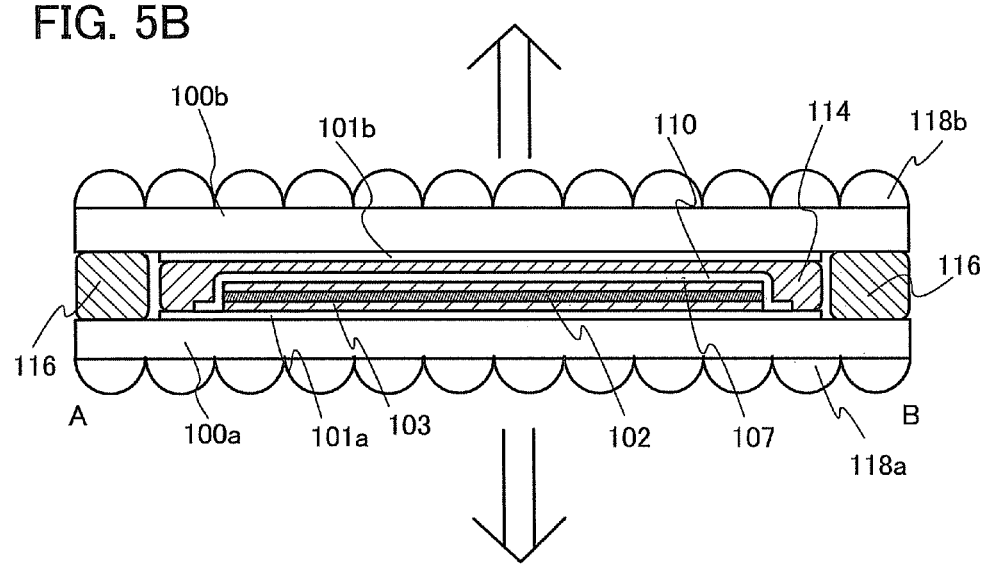

In a light-emitting device illustrated in FIG. 5B, a space is filled with the sealant 114. In the case of such a structure, there is a condition under which total reflection occurs at the interface between the second organic resin layer 100b and the air; therefore, an uneven structure 118b is preferably provided.

In the light-emitting device having a dual emission structure, an uneven structure is provided for the surfaces of the first organic resin layer 100a and the second organic resin layer 100b that are exposed to the air; accordingly, the amount of light that cannot be extracted to the air due to total reflection is reduced and the light extraction efficiency of the light-emitting device can be improved.

The other structures can be similar to those in Structural Example 1.

Examples of materials used for the respective layers are described below.

[Organic Resin Layer]

Examples of materials for the first organic resin layer 100a and the second organic resin layer 100b include a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinylchloride resin. A substrate in which a glass fiber is impregnated with a resin or a substrate in which an inorganic filler is mixed with an organic resin can also be used.

The first organic resin layer 100a and the second organic resin layer 100b are formed of the same material, whereby a defect in shape due to thermal strain or physical impact can be suppressed. Therefore, deformation of or damage to the light-emitting device in manufacture or use thereof can be suppressed.

Also in the case where the first organic resin layer 100a and the second organic resin layer 100b are formed of different materials, a structure in which a defect in shape due to thermal strain or physical impact is suppressed is preferably employed by adjusting combination of materials and thicknesses thereof as appropriate.

[Glass Layer]

As a material for the first glass layer 101a and the second glass layer 101b, glass with a thickness greater than or equal to 25 μm and less than or equal to 100 μm can be used.

In a light-emitting device according to one embodiment of the present invention, as a supporting substrate and a sealing substrate for a light-emitting element, a substrate in which an organic resin layer and a glass layer are attached to each other is used. Consequently, the light-emitting device can be reduced in weight. Further, entry of moisture, an impurity, or the like into an organic compound or a metal material included in the light-emitting element from the outside of the light-emitting device can be suppressed.

[Light-Emitting Element]

Structural Examples 1 and 2 show a light-emitting device having a bottom emission structure. Therefore, the first electrode 103 has a light-transmitting property. Structural Examples 3 and 4 show a light-emitting device having a dual emission structure. Therefore, the first electrode 103 and the second electrode 107 each have a light-transmitting property.

As a material having a light-transmitting property that can be used for the first electrode 103 (or the second electrode 107), indium oxide, indium tin oxide (ITO), indium zinc oxide, zinc oxide, zinc oxide to which gallium is added, graphene, or the like can be used.

In addition, as the first electrode 103 (or the second electrode 107), a metal material such as gold, platinum, nickel, tungsten, chromium, molybdenum, iron, cobalt, copper, palladium, or titanium can be used. Further, a nitride of the metal material (such as titanium nitride) or the like may be used. In the case of using the metal material (or the nitride thereof), the first electrode 103 may be thin so as to transmit light.

The EL layer 102 includes at least a layer containing a light-emitting organic compound. In addition, the EL layer 102 can have a layered structure in which a layer containing a substance having an excellent electron-transport property, a layer containing a substance having an excellent hole-transport property, a layer containing a substance having an excellent electron-injection property, a layer containing a substance having an excellent hole-injection property, a layer containing a bipolar substance (a substance having an excellent electron-transport property and an excellent hole-transport property), and the like are combined as appropriate. An example of a structure of the EL layer 102 will be described in detail in Embodiment 8.

In Structural Examples 1 and 2, the second electrode 108 is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on and in contact with an aluminum alloy film, whereby oxidation of the aluminum alloy film can be prevented. As examples of a material for the metal film or the metal oxide film, titanium, titanium oxide, and the like are given.

[Sealing Layer]

The sealing layer 110 is in contact with the first glass layer 101a, and covers the light-emitting element. The sealing layer 110 is not necessarily provided; however, by providing the sealing layer 110, moisture, an impurity, or the like can be further prevented from entering an organic compound or a metal material included in the light-emitting element from the outside of the light-emitting element. As a material for the sealing layer 110, for example, silicon nitride, silicon oxide, alumina, or the like can be used.

[Sealant]

A known material can be used as the sealant. For example, a thermosetting material or an ultraviolet curable material may be used. As the sealant 114, a material with which glass layers can be bonded to each other is used. As the sealant 116, a material with which organic resins can be bonded to each other is used. It is preferable that these materials transmit as little moisture and oxygen as possible. A sealant with a desiccant can also be used.

The space 112 may include a desiccant. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the desiccant.

[Uneven Structure Formed on Organic Resin Layer]

Although the uneven structure 118a and the uneven structure 118b bring about an advantageous effect even in the case where they are in a stripe form, they are preferably in a matrix. The pattern of the uneven structures is not particularly limited. The uneven structures can have, for example, a hemispherical pattern, or a pattern with an apex such as a circular cone, a pyramid (e.g., a triangular pyramid or a quadrangular pyramid), or an umbrella-like shape.

The size or height of an unevenness of the uneven structure is preferably about greater than or equal to 0.1 μm and less than or equal to 1000 μm, but may exceed 1000 μm. In particular, the unevenness preferably has a size or height of 1 μm or more, in which case influence of interference of light can be suppressed.

It is preferable that patterns be provided so that a space is not formed between adjacent patterns. Therefore, the patterns preferably have a shape with which they can be arranged on a plane surface without any space. The patterns may be formed on the entire surface, which is exposed to the air, of the organic resin layer or part thereof. The patterns are preferably formed at least in a light-emitting region.

As a method for forming an uneven structure directly on the organic resin layer, for example, an etching method, a sand blasting method, a microblast processing method, a droplet discharge method, a printing method (screen printing or offset printing by which a pattern is formed), a coating method such as a spin coating method, a dipping method, a dispenser method, a nano-imprinting method, or the like can be employed as appropriate.

Alternatively, an uneven structure may be formed in such a manner that a hemispherical lens, a micro lens array, a film provided with an uneven structure, a light diffusing film, or the like is bonded to the surface of the organic resin layer with the use of a known adhesive or the like.

As described above, in the light-emitting device described in this embodiment, as the supporting substrate and the sealing substrate for the light-emitting element, the substrate in which the organic resin layer and the glass layer are attached to each other is used. Consequently, the light-emitting device can be reduced in weight. Further, entry of moisture, an impurity, or the like into an organic compound or a metal material included in the light-emitting element from the outside of the light-emitting device can be suppressed.

Further, in the light-emitting device, by providing the uneven structure on the surface exposed to the air, the proportion of light which cannot be extracted to the air owing to total reflection can be reduced and the light extraction efficiency of the light-emitting device can be improved.

This embodiment can be freely combined with any of the other embodiments.

Embodiment 2

In this embodiment, a manufacturing method of a light-emitting device according to one embodiment of the present invention which is described Embodiment 1 will be described with reference to FIGS. 7A to 7E and FIGS. 8A to 8D.

Manufacturing Method 1

Structural Example 1

One example of a manufacturing method of Structural Example 1 (see FIG. 2A) will be described with reference to FIGS. 7A to 7E.

Figure 7A:
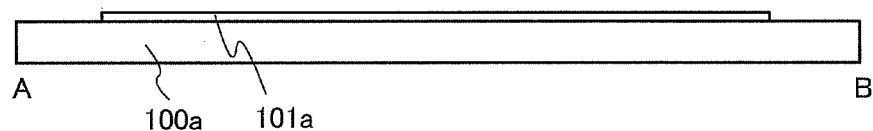
FIGS. 7A to 7E illustrate a manufacturing method of a light-emitting device according to one embodiment of the present invention.

First, the first glass layer 101a is formed over the first organic resin layer 100a with the use of an adhesive (FIG. 7A).

Next, the light-emitting element (the first electrode 103, the EL layer 102, and the second electrode 108) is formed over the first glass layer 101a.

The first electrode 103 and the second electrode 108 each can be formed by a sputtering method, an evaporation method (including a vacuum evaporation method), or the like. The EL layer 102 can be formed by an evaporation method (including a vacuum evaporation method), an inkjet method, a coating method, or the like.

Figure 7B:
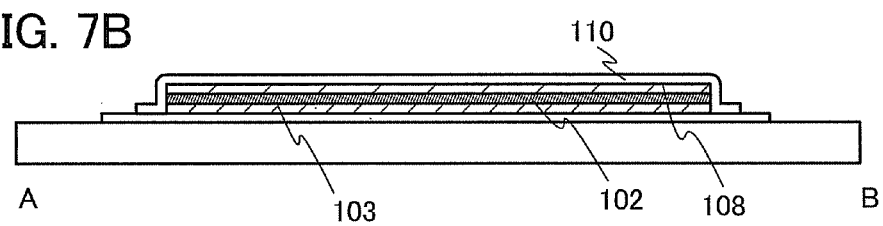

Then, the sealing layer 110 is formed over the first glass layer 101a so as to cover the light-emitting element (FIG. 7B). In this embodiment, a silicon nitride film is formed by a sputtering method.

Figure 7C:
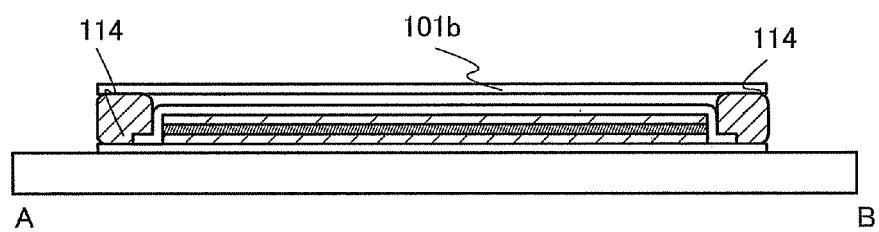

Next, the first glass layer 101a and the second glass layer 101b are attached to each other with the sealant 114 (FIG. 7C). In this embodiment, a sealant with a desiccant is used as the sealant 114.

Figure 7D:
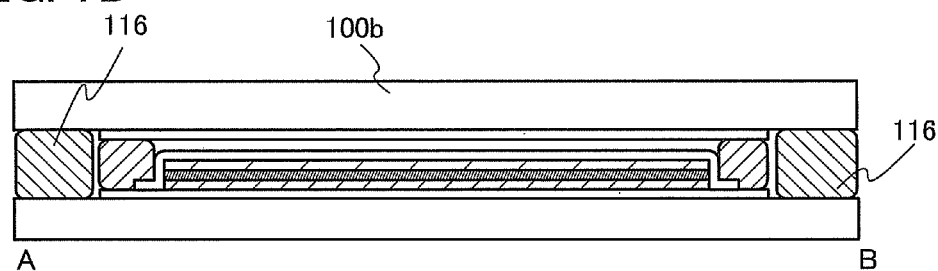

Further, the first organic resin layer 100a and the second organic resin layer 100b are attached to each other with the sealant 116 (FIG. 7D).

Through the above process, the light-emitting device described in Structural Example 1 can be manufactured.

Structural Example 2

Figure 7E:
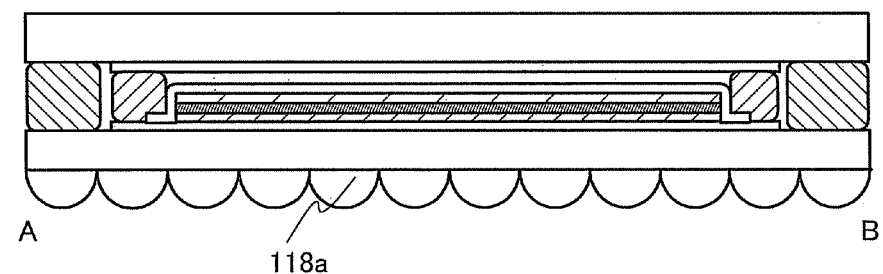

After the manufacturing process of Structural Example 1, the uneven structure 118a is provided on the surface exposed to the air of the first organic resin layer 100a. In such a manner, Structural Example 2 (see FIG. 3) can be manufactured (FIG. 7E). There is no particular limitation on the timing to form the uneven structure 118a on the first organic resin layer 100a. In order to prevent the uneven structure 118a from being damaged during a formation process of the light-emitting element or the like or during transfer, the uneven structure 118a is preferably formed after the light-emitting element and the like are formed over the first organic resin layer 100a (or after the light-emitting element is sealed).

The other layers can be formed by forming methods similar to those in Structural Example 1.

Structural Example 3

In the above manufacturing process of Structural Example 1, the second electrode is formed using a light-transmitting material. In such a manner, Structural Example 3 (see FIG. 4) can be manufactured. The other layers can be formed by forming methods similar to those in Structural Example 1.

Structural Example 4

After the manufacturing process of Structural Example 3, the uneven structure 118a is provided on the surface exposed to the air of the first organic resin layer 100a. In such a manner, Structural Example 4 illustrated in FIG. 5A can be manufactured. Further, the uneven structure 118b is provided on the surface exposed to the air of the second organic resin layer 100b. In such a manner, Structural Example 4 illustrated in FIG. 5B can be manufactured.

By the above-described method, a light-emitting device according to one embodiment of the present invention described in Embodiment 1 can be manufactured.

Manufacturing Method 2

Structural Example 1

Another example of a manufacturing method of Structural Example 1 (see FIG. 2A) will be described with reference to FIGS. 8A to 8D.

Figure 8A:
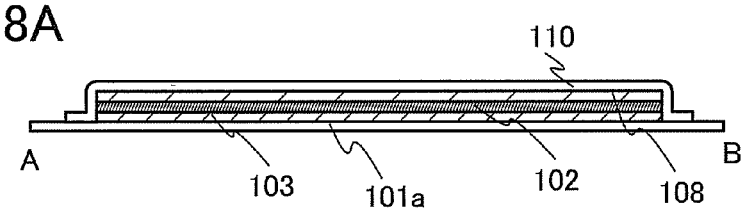
FIGS. 8A to 8D illustrate a manufacturing method of a light-emitting device according to one embodiment of the present invention.

First, the light-emitting element (the first electrode 103, the EL layer 102, and the second electrode 108) is formed over the first glass layer 101a. Then, the sealing layer 110 is formed over the first glass layer 101a so as to cover the light-emitting element (FIG. 8A).

Here, in the case where the first glass layer 101a has flexibility, a roll-to-roll method may be employed in which the light-emitting element is formed over the rolled first glass layer 101a.

Figure 8B:
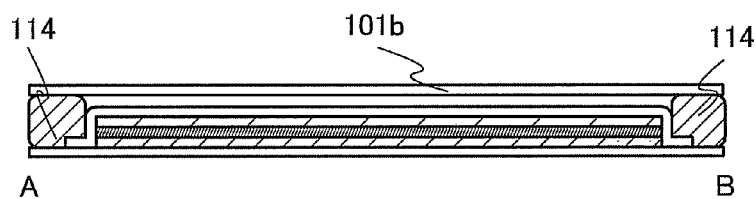

Next, the first glass layer 101a and the second glass layer 101b are attached to each other with the sealant 114 (FIG. 8B). Hereinafter, a structure illustrated in FIG. 8B is referred to as a stacked body A.

Figure 8C:
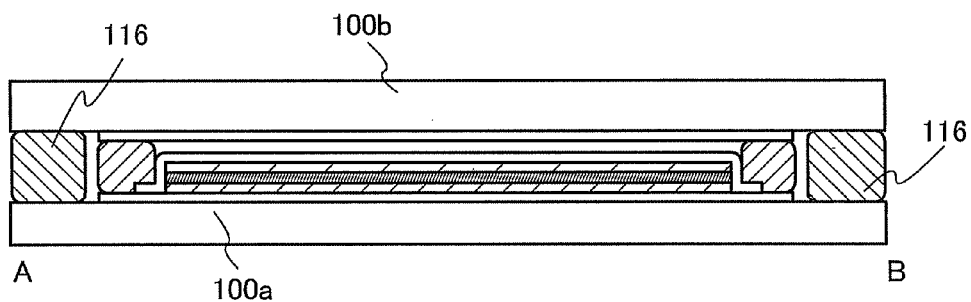

Further, the first organic resin layer 100a and the second organic resin layer 100b are attached to each other with the sealant 116, so that the stacked body A is sealed (FIG. 8C).

In this embodiment, the stacked body A is arranged between the first organic resin layer 100a and the second organic resin layer 100b, which is inserted between a pair of pressure rollers. Then, it is subjected to pressure treatment while being heated. An adhesive and the sealant 116 are applied to (or may be dropped to or stacked on, for example) the first organic resin layer 100a and the second organic resin layer 100b in advance; thus, through heat treatment and pressure treatment, the first organic resin layer 100a and the first glass layer 101a are bonded to each other, the second organic resin layer 100b and the second glass layer 101b are bonded to each other, and the first organic resin layer 100a and the second organic resin layer 100b are bonded to each other. Note that in the case where neither the adhesive nor the sealant is of a thermosetting type (for example, in the case where they are of a UV curable type), heat treatment is unnecessary.

Through the above process, the light-emitting device described in Structural Example 1 can be manufactured.

Structural Example 2

Figure 8D:
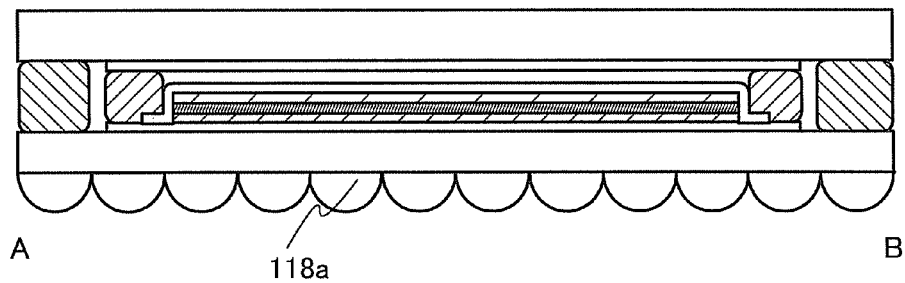

After the manufacturing process of Structural Example 1, the uneven structure 118a is provided on the surface, which is exposed to the air, of the first organic resin layer 100a. In such a manner, Structural Example 2 (see FIG. 3) can be manufactured (FIG. 8D). Alternatively, the first organic resin layer 100a provided with the uneven structure 118a may be attached to the second organic resin layer 100b with the sealant 116.

The other layers can be formed by forming methods similar to those in Structural Example 1.

Structural Example 3

In the above manufacturing process of Structural Example 1, the second electrode is formed using a light-transmitting material. In such a manner, Structural Example 3 (see FIG. 4) can be manufactured. The other layers can be formed by forming methods similar to those in Structural Example 1.

Structural Example 4

After the manufacturing process of Structural Example 3, the uneven structure 118a is provided on the surface, which is exposed to the air, of the first organic resin layer 100a. In such a manner, Structural Example 4 illustrated in FIG. 5A can be manufactured. Further, the uneven structure 118b is provided on the surface exposed to the air of the second organic resin layer 100b. In such a manner, Structural Example 4 illustrated in FIG. 5B can be manufactured.

Alternatively, the first organic resin layer 100a provided with the uneven structure 118a and the second organic resin layer 100b provided with the uneven structure 118b may be attached to each other with the sealant 116.

By the above-described manufacturing method, a light-emitting device according to one embodiment of the present invention can be manufactured.

This embodiment can be freely combined with any of the other embodiments.

Embodiment 3

In this embodiment, a light-emitting device according to one embodiment of the present invention, which has a structure different from that in Embodiment 1, will be described with reference to FIG. 1 and FIGS. 6A and 6B.

In Embodiment 1, a structure is described in which the first electrode 103 of the light-emitting element and the first glass layer 101a are in contact with each other (see FIGS. 2A to 2C, FIG. 3, FIG. 4, and FIGS. 5A and 5B). In general, the refractive index of glass is approximately 1.5, which is lower than that of the EL layer 102 (e.g., 1.6 or higher). Accordingly, when light enters the first glass layer 101a from the first electrode 103, total reflection occurs in some cases. Therefore, an uneven structure body is preferably provided between the first electrode 103 and the first glass layer 101a.

However, in the case where the first electrode 103 is uneven, leakage current might be generated in the EL layer 102 or the like formed over the first electrode 103.

In the light-emitting device described in this embodiment, the uneven structure body is provided over the first glass layer, a first resin layer is provided over the uneven structure body, and the first electrode is provided over the plane first resin layer; thus, leakage current in the EL layer or the like can be suppressed.

Since the uneven structure body is provided, the amount of light that cannot be extracted to the air due to total reflection at the interface between the first glass layer and the first resin layer is reduced and the light extraction efficiency of the light-emitting device can be improved.

The first resin layer is formed using a material whose refractive index is higher than or equal to that of the EL layer (in particular, the layer containing a light-emitting organic compound), whereby a light-emitting device having a structure in which total reflection in the light-emitting device is suppressed can be realized.

Structural Example 5

FIG. 6A illustrates one example of a light-emitting device having a bottom emission structure.

The light-emitting device illustrated in FIG. 6A includes the first organic resin layer 100a provided with the uneven structure 118a, the first glass layer 101a provided with an uneven structure body 122a, a first resin layer 124a, a first protective layer 120a, the light-emitting element (the first electrode 103, the EL layer 102, and the second electrode 108), the second glass layer 101b, and the second organic resin layer 100b.

Since Structural Example 5 has a bottom emission structure, the first electrode 103 has a light-transmitting property.

In Structural Example 5, the refractive index of the first resin layer 124a is higher than or equal to that of the layer containing a light-emitting organic compound in the EL layer 102 or higher than or equal to that of the first electrode 103. Further, the refractive index of the first protective layer 120a is higher than or equal to that of the first resin layer 124a. With such a structure, total reflection at the interface between the first resin layer 124a and the first protective layer 120a and the interface between the first protective layer 120a and the first electrode 103 can be suppressed.

In Structural Example 5, the refractive index of the first glass layer 101a is lower than that of the layer containing a light-emitting organic compound (e.g., 1.6 or higher) in the EL layer 102. Therefore, there is a condition under which total reflection occurs at the interface between the first glass layer 101a and the first resin layer 124a.

In Structural Example 5, the first glass layer 101a is provided with the uneven structure body 122a on its surface in contact with the first resin layer 124a. Therefore, a phenomenon can be suppressed, phenomenon in which light falling on the interface at an incidence angle exceeding a critical angle is totally reflected and the wave of the light propagates inside the light-emitting device to lower the light extraction efficiency.

The other structures can be similar to those in Structural Example 1.

Structural Example 6

FIG. 6B illustrates one example of a light-emitting device having a dual emission structure.

The light-emitting device illustrated in FIG. 6B includes the first organic resin layer 100a provided with the uneven structure 118a, the first glass layer 101a provided with the uneven structure body 122a, the first resin layer 124a, the first protective layer 120a, the light-emitting element (the first electrode 103, the EL layer 102, and the second electrode 107), a second protective layer 120b, a second resin layer 124b, the second glass layer 101b provided with an uneven structure body 122b, and the second organic resin layer 100b provided with the uneven structure 118b.

Since Structural Example 6 has a dual emission structure, the first electrode 103 and the second electrode 107 each have a light-transmitting property.

In Structural Example 6, the refractive index of the first resin layer 124a is higher than or equal to that of the layer containing a light-emitting organic compound in the EL layer 102 or higher than or equal to that of the first electrode 103. Further, the refractive index of the second resin layer 124b is higher than or equal to that of the layer containing a light-emitting organic compound in the EL layer 102 or higher than or equal to that of the second electrode 108. Furthermore, the refractive index of the first protective layer 120a is higher than or equal to that of the first resin layer 124a. Furthermore, the refractive index of the second protective layer 120b is higher than or equal to that of the second resin layer 124b.

With such a structure, total reflection at the interface between the first resin layer 124a and the first protective layer 120a, the interface between the first protective layer 120a and the first electrode 103, the interface between the second resin layer 124b and the second protective layer 120b, and the interface between the second protective layer 120b and the second electrode 107 can be suppressed.

In Structural Example 6, the refractive index of the first glass layer 101a and that of the second glass layer 101b are lower than that of the layer containing a light-emitting organic compound (e.g., 1.6 or higher) in the EL layer 102. Therefore, there is a condition under which total reflection occurs at the interface between the first glass layer 101a and the first resin layer 124a and the interface between the second glass layer 101b and the second resin layer 124b.

In Structural Example 6, the first glass layer 101a is provided with the uneven structure body 122a on its surface in contact with the first resin layer 124a. Further, the second glass layer 101b is provided with the uneven structure body 122b on its surface in contact with the second resin layer 124b. Therefore, a phenomenon can be suppressed, in which light entering the interface at an incidence angle exceeding a critical angle is totally reflected and the wave of the light propagates inside the light-emitting device to lower the light extraction efficiency.

The other structures can be similar to those in Structural Example 1.

Examples of materials used for the respective layers are described below.

The organic resin layer, the glass layer, the light-emitting element, and the uneven structure provided for the organic resin layer in this embodiment can be formed using materials similar to those in Embodiment 1.

[Resin Layer]

As examples of a material for the first resin layer 124a and the second resin layer 124b, liquid, a resin, and the like with a high refractive index are given. The first resin layer 124a and the second resin layer 124b each have a light-transmitting property. As examples of a resin with a high refractive index, a resin containing bromine, a resin containing sulfur, and the like are given. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used. As liquid with a high refractive index, contact liquid (refractive liquid) containing sulfur and methylene iodide, or the like can be used. Any of a variety of methods suitable for the material may be employed for forming the first resin layer 124a and the second resin layer 124b. For example, any of the above resins is deposited by a spin coating method and is cured by heat or light, so that the first resin layer 124a and the second resin layer 124b can be formed. The material and the deposition method can be selected as appropriate in consideration of the adhesion strength, ease of processing, or the like.

[Protective Layer]

As the first protective layer 120a and the second protective layer 120b, for example, a silicon nitride film, a silicon nitride oxide film, an aluminum nitride film, or the like can be used. The first protective layer 120a and the second protective layer 120b are not necessarily provided; however, with the first protective layer 120a and the second protective layer 120b, moisture can be prevented from entering the EL layer 102 from the first resin layer 124a and the second resin layer 124b and a reduction in lifetime of the light-emitting device can be suppressed.

[Uneven Structure Body Formed on Glass Layer]

The uneven structure body can be formed in such a manner that a hemispherical lens, a micro lens array, a film provided with an uneven structure, a light diffusing film, or the like is bonded to a surface of the glass layer with the use of a known adhesive or the like.

Although the uneven structure body formed on the glass layer brings about an advantageous effect even in the case where it is in a stripe form, it is preferably in a matrix. The pattern of the uneven structure body is not particularly limited. The uneven structure body can have, for example, a hemispherical pattern, or a pattern with an apex such as a circular cone, a pyramid (e.g., a triangular pyramid or a quadrangular pyramid), or an umbrella-like shape.

The size or height of an unevenness of the uneven structure is preferably about greater than or equal to 0.1 μm and less than or equal to 1000 μm. In particular, the unevenness preferably has a size or height of 1 μm or more, in which case influence of interference of light can be reduced. The size or height of the unevenness affects the amount of material used for the resin layer. The size or height of the unevenness is preferably 100 μm or less, in which case a large amount of material for the resin layer does not need to be used.

When the patterns of the uneven structure body which is formed on the glass layer and whose size is in the above range have periodicity, the uneven structure body functions as a diffraction grating; thus, an interference effect becomes large and light with a specific wavelength is easily extracted to the air. Therefore, the patterns of the uneven structure body preferably have no periodicity. Further, the patterns may be formed at least in a light-emitting region.

As described above, in the light-emitting device described in this embodiment, as a supporting substrate and a sealing substrate for the light-emitting element, the substrate in which the organic resin layer and the glass layer are attached to each other is used. Consequently, the light-emitting device can be reduced in weight. Further, entry of moisture, an impurity, or the like into an organic compound or a metal material included in the light-emitting element from the outside of the light-emitting device can be suppressed.

Further, in the light-emitting device, when an interface where total reflection occurs under a certain condition is uneven, a phenomenon can be suppressed, in which light entering the interface at an incidence angle exceeding a critical angle is totally reflected and the wave of the light propagates inside the light-emitting device to lower the light extraction efficiency.

This embodiment can be freely combined with any of the other embodiments.

Embodiment 4

In this embodiment, a manufacturing method of a light-emitting device according to one embodiment of the present invention which is described Embodiment 3 will be described with reference to FIGS. 9A to 9D and FIGS. 10A to 10C.

Structural Example 5

One example of a manufacturing method of Structural Example 5 (see FIG. 6A) will be described with reference to FIGS. 9A to 9D.

Figure 9A:
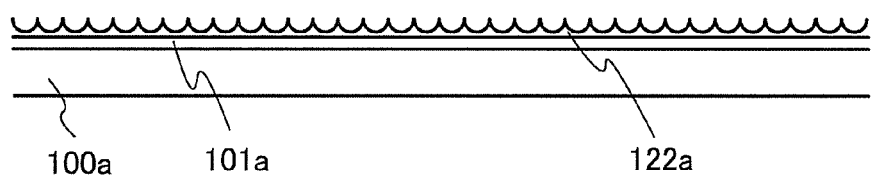
FIGS. 9A to 9D illustrate a manufacturing method of a light-emitting device according to one embodiment of the present invention.

First, the first glass layer 101a is formed over the first organic resin layer 100a with an adhesive inbetween, and the uneven structure body 122a is formed over the first glass layer 101a (FIG. 9A).

Figure 9B:
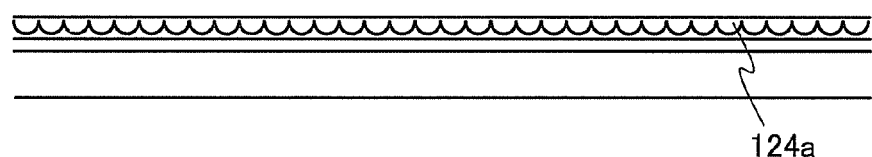

Next, the first resin layer 124a is formed over the uneven structure body 122a. Here, the first resin layer 124a is formed so that, compared to a surface thereof in contact with the uneven structure body 122a, the other surface is planar (FIG. 9B).

Figure 9C:
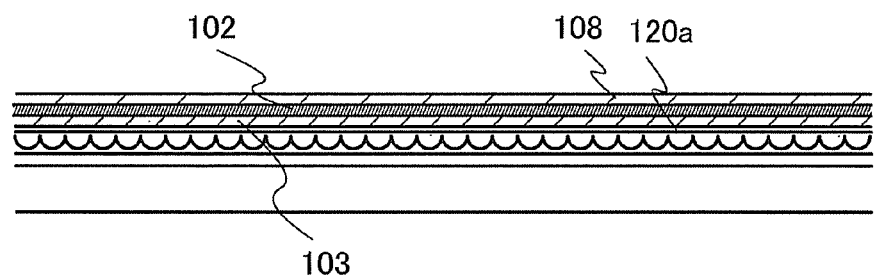

Then, the first protective layer 120a is formed over the first resin layer 124a, and the light-emitting element (the first electrode 103, the EL layer 102, and the second electrode 108) is formed over the first protective layer 120a (FIG. 9C).

After that, the first glass layer 101a and the second glass layer 101b are attached to each other with a sealant (not illustrated). Further, the first organic resin layer 100a and the second organic resin layer 100b are attached to each other with a sealant. At this time, the first organic resin layer 100a provided with the uneven structure 118a and the second organic resin layer 100b can be attached to each other. Alternatively, the uneven structure 118a may be formed after the first organic resin layer 100a and the second organic resin layer 100b are attached to each other.

Figure 9D:
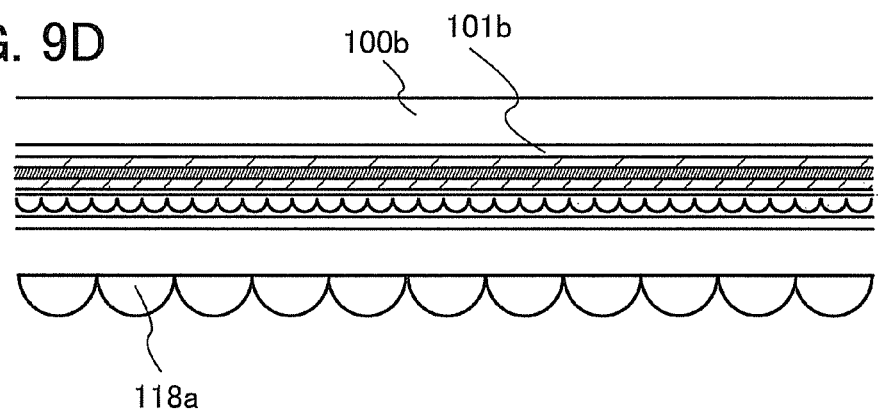

Through the above process, the light-emitting device described in Structural Example 5 can be manufactured (FIG. 9D).

Note that as in Manufacturing Method 2 described in Embodiment 2, the first organic resin layer 100a and the second organic resin layer 100b may be bonded to the first glass layer 101a and the second glass layer 101b respectively, after the light-emitting element and the like are manufactured over the first glass layer 101a and the first glass layer 101a and the second glass layer 101b are attached to each other.

Structural Example 6

One example of a manufacturing method of Structural Example 6 (see FIG. 6B) will be described with reference to FIGS. 9A to 9D and FIGS. 10A to 10C.

First, as in the manufacturing process of Structural Example 5, the first glass layer 101a is formed over the first organic resin layer 100a, and the uneven structure body 122a is formed over the first glass layer 101a (FIG. 9A). Next, the first resin layer 124a is formed over the uneven structure body 122a. Here, the first resin layer 124a is formed so that, compared to a surface thereof in contact with the uneven structure body 122a, the other surface is planar (FIG. 9B).

Then, the first protective layer 120a is formed over the first resin layer 124a, and the light-emitting element (the first electrode 103, the EL layer 102, and the second electrode 108) is formed over the first protective layer 120a (FIG. 9C).

Figure 10A:
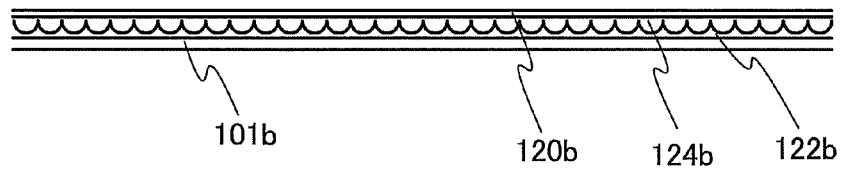
FIGS. 10A to 10C illustrate a manufacturing method of a light-emitting device according to one embodiment of the present invention.

On the other hand, as illustrated in FIG. 10A, the uneven structure body 122b is provided over the second glass layer 101b, the second resin layer 124b is formed over the uneven structure body 122b, and the second protective layer 120b is formed over the second resin layer 124b. Here, the second resin layer 124b is formed so that, compared to a surface thereof in contact with the uneven structure body 122b, the other surface is planar.

Figure 10B:
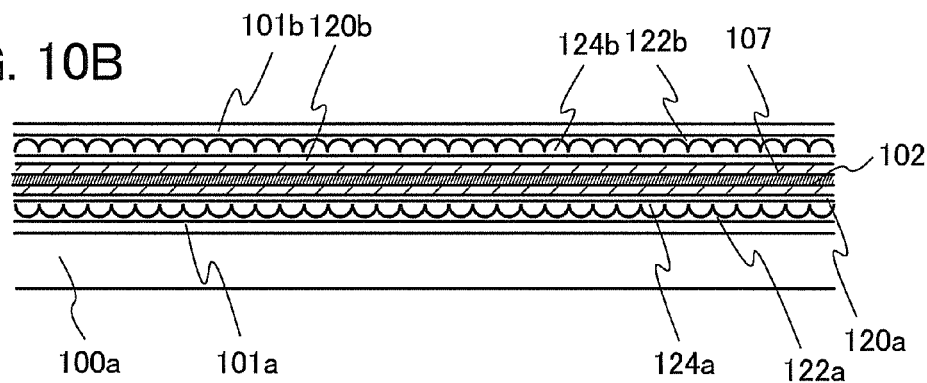

Next, the first glass layer 101a and the second glass layer 101b are attached to each other with a sealant (not illustrated) (FIG. 10B).

Further, the first organic resin layer 100a and the second organic resin layer 100b are attached to each other with a sealant. At this time, the first organic resin layer 100a provided with the uneven structure 118a can be attached to the second organic resin layer 100b provided with the uneven structure 118b. Alternatively, the uneven structure 118a and the uneven structure 118b may be formed after the first organic resin layer 100a and the second organic resin layer 100b are attached to each other.

Figure 10C:
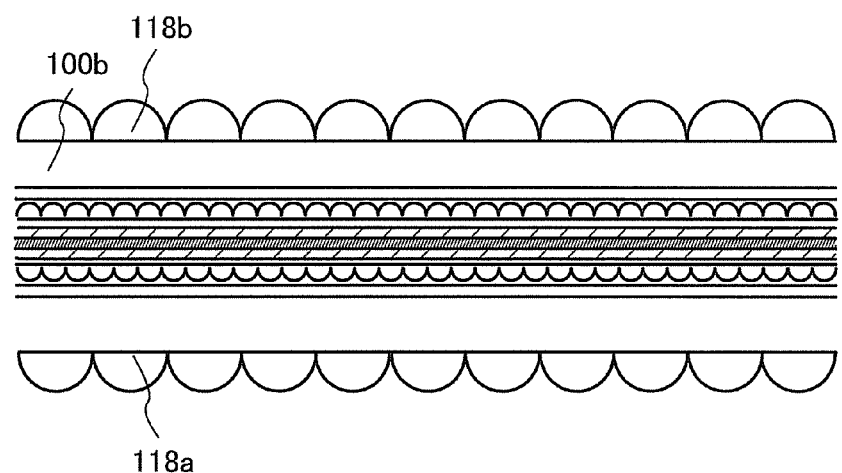

Through the above process, the light-emitting device described in Structural Example 6 can be manufactured (FIG. 10C).

Note that as in Manufacturing Method 2 described in Embodiment 2, the first organic resin layer 100a and the second organic resin layer 100b may be bonded to the first glass layer 101a and the second glass layer 101b respectively, after the light-emitting element and the like are manufactured over the first glass layer 101a and the first glass layer 101a and the second glass layer 101b are attached to each other.

This embodiment can be freely combined with any of the other embodiments.

Embodiment 5

In this embodiment, a light-emitting device according to one embodiment of the present invention, which has a structure different from that in the above embodiments, will be described.

In a light-emitting device, when light from an EL layer enters a medium whose refractive index is different from that of the EL layer, the light is partially reflected. The larger a difference in refractive index between two mediums is, the more likely the light is to be reflected; thus, the light extraction efficiency of the light-emitting device is decreased.

In Embodiment 1, a structure in which the first electrode 103 of the light-emitting element and the first glass layer 101a are in contact with each other is described (see FIGS. 2A to 2C, FIG. 3, FIG. 4, and FIGS. 5A and 5B).

In general, the refractive index of glass is approximately 1.5. The refractive index of the first electrode 103 is 2.0 in the case of using, for example, ITO. In this manner, there is a case where a difference in refractive index between the first glass layer 101a and the first electrode 103 is large.

The light-emitting device described in this embodiment includes, between a glass layer and an electrode, an insulating film containing gallium (Ga) or aluminum (Al), zinc (Zn), and oxygen (O). A difference in refractive index between the insulating film containing Zn, O, and one of Ga and Al and the glass layer and that between the insulating film containing Zn, O, and one of Ga and Al and the electrode are each 0.2 or less; thus, light reflection due to a difference in refractive index can be suppressed.

Further, a difference in refractive index between the insulating film containing Zn, O, and one of Ga and Al and a layer in contact therewith is preferably 0.15 or less because reflection of light due to a difference in refractive index (in the case of perpendicular incidence) can be reduced to 1% or less. The smaller the difference in refractive index is, the more light reflection due to the difference in refractive index can be suppressed.

Structural Example 7

Figure 11:
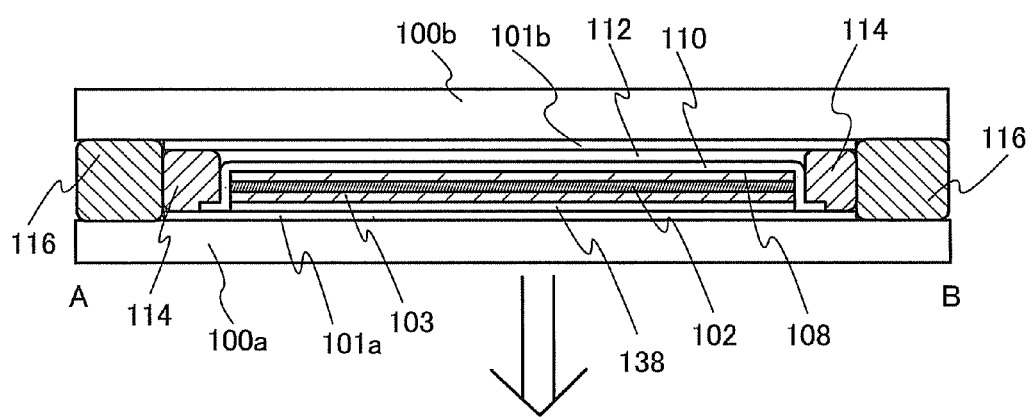
FIG. 11 illustrates a light-emitting device according to one embodiment of the present invention.

FIG. 11 illustrates one example of a light-emitting device having a bottom emission structure. FIG. 11 is a cross-sectional view taken along line A-B in FIG. 1.

The light-emitting device illustrated in FIG. 11 includes the first organic resin layer 100a, the first glass layer 101a, an insulating film 138, the light-emitting element (the first electrode 103, the EL layer 102, and the second electrode 108), the sealing layer 110, the second glass layer 101b, and the second organic resin layer 100b.

Since Structural Example 7 has a bottom emission structure, the first electrode 103 has a light-transmitting property.

In Structural Example 7, a structure is employed in which the whole insulating film 138 and the light-emitting element are covered with the sealing layer 110; however, the present invention is not limited to this, and a structure can also be employed in which the sealing layer 110 is formed over part of the insulating film 138 so as to cover the light-emitting element, for example.

The refractive index of the insulating film 138 is set so that a difference in refractive index between the insulating film 138 and a layer in contact therewith is 0.2 or less. The insulating film 138 includes one or more insulating films containing Zn, O, and one of Ga and Al.

In the case where the refractive index of the first glass layer 101a is 1.5 and that of the first electrode 103 is 2.0, the following structure is employed, for example: the insulating film 138 is formed of two layers, in which an insulating film containing Ga, Zn, and O and having a refractive index of 1.7 is provided as a first layer over the first glass layer 101a, and an insulating film containing Ga, Zn, and O and having a refractive index of 1.8 is provided over the insulating film and in contact with the first electrode 103. In such a manner, light reflection due to a difference in refractive index can be suppressed.

The insulating film 138 has a light-transmitting property. Accordingly, light extraction is not inhibited, which is preferable.

The insulating film 138 may contain nitrogen (N). The insulating film 138 is formed by combination of these elements, whereby the reflective index thereof can be a desired value with its light-transmitting property with respect to visible light kept.

For example, as a material used for the insulating film 138, a Ga—Zn—O-based material, an Al—Zn—O-based material, a Ga—Zn—O—N-based material, an Al—Zn—O—N-based material, a Ga—Al—Zn—O-based material, and a Ga—Al—Zn—O—N-based material can be given. Here, for example, a Ga—Zn—O-based material means a material containing gallium, zinc, and oxygen as its main component.

In the insulating film 138, the ratio of the sum of Ga, Al, Zn, O, and N to the total is preferably 0.90 or more [atomic ratio], more preferably 0.97 or more [atomic ratio]. In other words, the sum of elements other than Ga, Al, Zn, O, and N to the total is preferably 0.10 or less [atomic ratio], more preferably 0.03 or less [atomic ratio].

The insulating film 138 can be formed by, for example, a sputtering method using a Ga—Zn—O-based metal oxide target ($Ga_2O_3$:ZnO=1:5 to 5:1 [molar ratio]) in an oxygen atmosphere or a mixed atmosphere of argon and oxygen (the flow ratio is, for example, argon:oxygen=7:3). Alternatively, the insulating film 138 can be formed using an Al—Zn—O-based metal oxide target ($Al_2O_3$:ZnO=1:5 to 5:1 [molar ratio]) in an atmosphere similar to the above. Further alternatively, an insulating film containing nitrogen, Zn, O, and one of Ga and Al can be obtained using a target similar to the above in a mixed atmosphere of argon, oxygen, and nitrogen (the flow ratio is, for example, argon:oxygen:nitrogen=3:6:1).

The specific resistivity of the insulating film 138 at 20° C. is preferably $10^{10}$ Ωcm or more, in which case the insulating film 138 can have a sufficient insulating property.

As described above, in the light-emitting device described in this embodiment, as a supporting substrate and a sealing substrate for the light-emitting element, the substrate in which the organic resin layer and the glass layer are attached to each other is used. Consequently, the light-emitting device can be reduced in weight. Further, entry of moisture, an impurity, or the like into an organic compound or a metal material included in the light-emitting element from the outside of the light-emitting device can be suppressed.

Further, in the light-emitting device, one or more insulating films containing Zn, O, and one of Ga and Al are provided between two layers having a large difference in refractive index, whereby light reflection due to a difference in refractive index can be suppressed. Consequently, a light-emitting device with high light extraction efficiency can be provided.

This embodiment can be freely combined with any of the other embodiments.

Embodiment 6

In this embodiment, a modified example of a light-emitting device according to one embodiment of the present invention which is described in Embodiment 1 will be described.

In a light-emitting device according to one embodiment of the present invention, a substrate in which an organic resin layer and a thin glass layer are attached to each other is employed. Therefore, in the case where a glass layer is thin enough to have flexibility, a light-emitting device with a curved surface and a light-emitting device with flexibility can be realized.

Modified Example

Figure 12A:
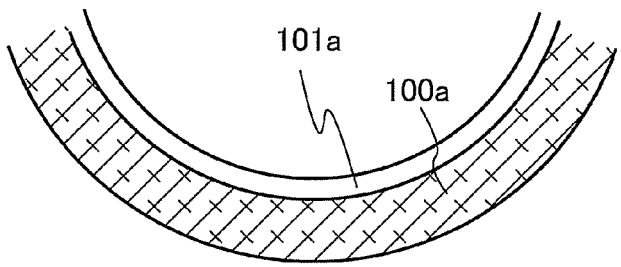
FIGS. 12A to 12D illustrate a light-emitting device according to one embodiment of the present invention.
Figure 12B:
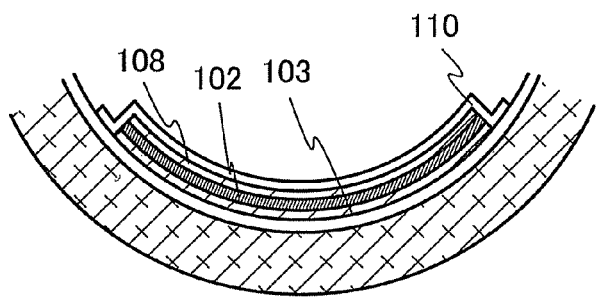
Figure 12C:
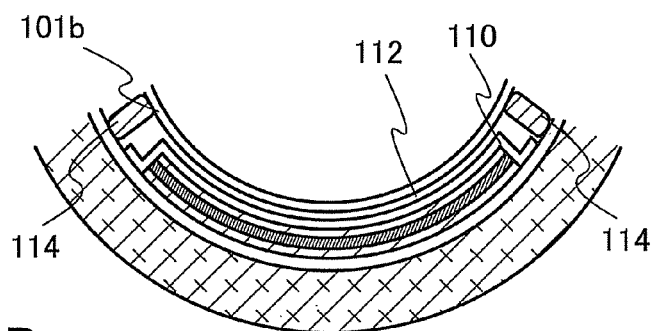
Figure 12D:
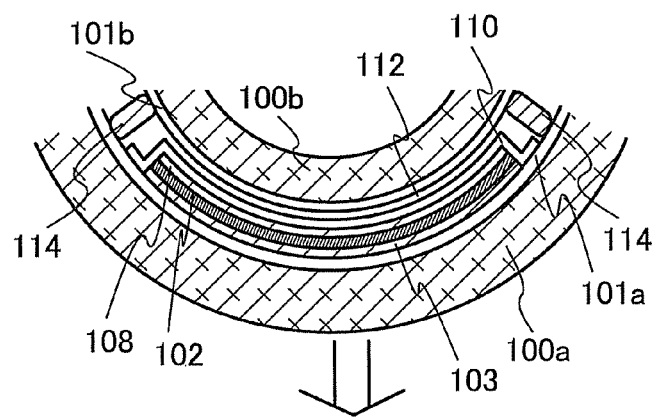

A light-emitting device with a curved surface illustrated in FIG. 12D includes the first organic resin layer 100a, the first glass layer 101a, the light-emitting element (the first electrode 103, the EL layer 102, and the second electrode 108), the sealing layer 110, the second glass layer 101b, and the second organic resin layer 100b.

In a modified example, the first glass layer 101a is formed using glass which is thin enough to have flexibility. For example, the thickness of the first glass layer 101a can be greater than or equal to 25 μm and less than or equal to 75 μm.

The other structures can be similar to those in Structural Example 1 described in Embodiment 1.

An example of a manufacturing method of the light-emitting device which is a modified example will be described.

First, the first glass layer 101a is formed over the first organic resin layer 100a with a curved surface with the use of an adhesive inbetween (FIG. 12A).

Next, the light-emitting element (the first electrode 103, the EL layer 102, and the second electrode 108) is formed over the first glass layer 101a.

Then, the sealing layer 110 is formed over the first glass layer 101a so as to cover the light-emitting element (FIG. 12B).

Next, the first glass layer 101a and the second glass layer 101b are attached to each other with the sealant 114 (FIG. 12C). At this time, the space 112 is filled with an inert gas.

Further, the first organic resin layer 100a and the second organic resin layer 100b are attached to each other with a sealant (not illustrated) (FIG. 12D).

Through the above process, the light-emitting device described as a modified example can be manufactured.

Next, another example of a manufacturing method of the light-emitting device which is a modified example will be described.

Figure 13A:
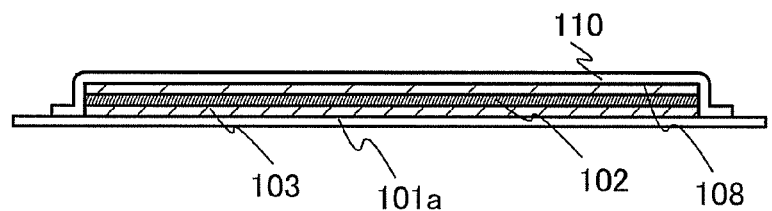
FIGS. 13A to 13C illustrate a light-emitting device according to one embodiment of the present invention.

First, the light-emitting element is formed over the first glass layer 101a. Then, the sealing layer 110 is formed over the first glass layer 101a so as to cover the light-emitting element (FIG. 13A).

Here, since the first glass layer 101a has flexibility, a roll-to-roll method can be employed in which the light-emitting element is formed over the rolled first glass layer 101a.

Figure 13B:
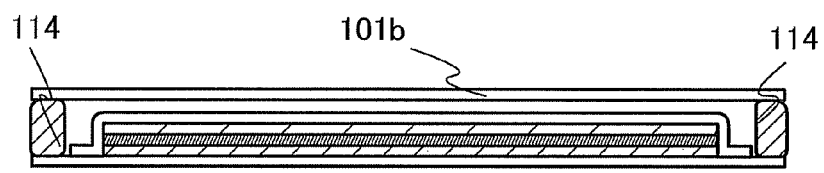

Next, the first glass layer 101a and the second glass layer 101b are attached to each other with the sealant 114 (FIG. 13B). Hereinafter, a structure illustrated in FIG. 13B is referred to as a stacked body B.

Figure 13C:
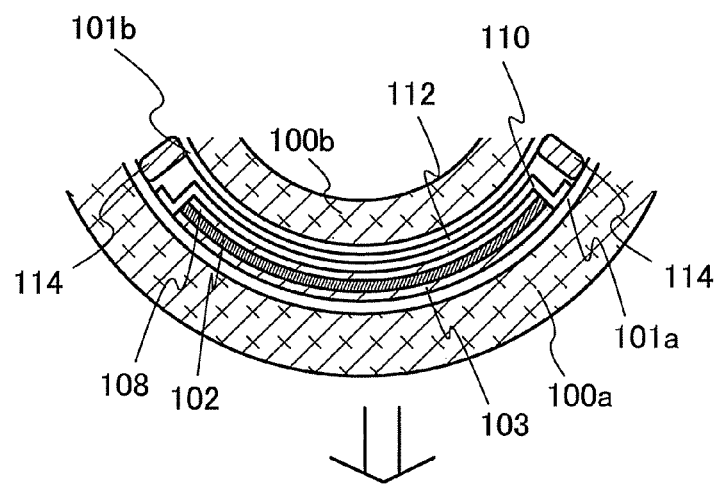

Lastly, the first organic resin layer 100a and the second organic resin layer 100b each having a curved surface are attached to each other with the sealant 116, so that the stacked body B is sealed (FIG. 13C).

For example, with the use of a pressure roller, the first organic resin layer 100a and the first glass layer 101a can be bonded to each other, the second organic resin layer 100b and the second glass layer 101b can be bonded to each other, and the first organic resin layer 100a and the second organic resin layer 100b can be bonded to each other as described in the above embodiment.

Through the above process, the light-emitting device described as a modified example can be manufactured.

As described above, in the light-emitting device described in this embodiment, as a supporting substrate and a sealing substrate for the light-emitting element, the substrate in which the organic resin layer and the glass layer are attached to each other is used. Consequently, the light-emitting device can be reduced in weight. Further, entry of moisture, an impurity, or the like into an organic compound or a metal material included in the light-emitting element from the outside of the light-emitting device can be suppressed.

Further, since the thin glass layer used in this embodiment is thin enough to have flexibility, a light-emitting device with a curved surface can be realized.

This embodiment can be freely combined with any of the other embodiments.

Embodiment 7

In this embodiment, a structure in which a converter is incorporated in a light-emitting device according to one embodiment of the present invention will be described with reference to FIGS. 14A to 14C. Note that in the following explanation, description of the same portions as those in any of the above embodiments will be omitted.

Note that in this embodiment, a converter means a converter circuit functioning as a constant current supply which converts input power into a constant current suitable for the specifications of a light-emitting device and inputs the constant current to the light-emitting device or as a constant voltage supply which converts input power into a constant voltage suitable for the specifications of the light-emitting device and inputs the constant voltage to the light-emitting device.

Figure 14A:
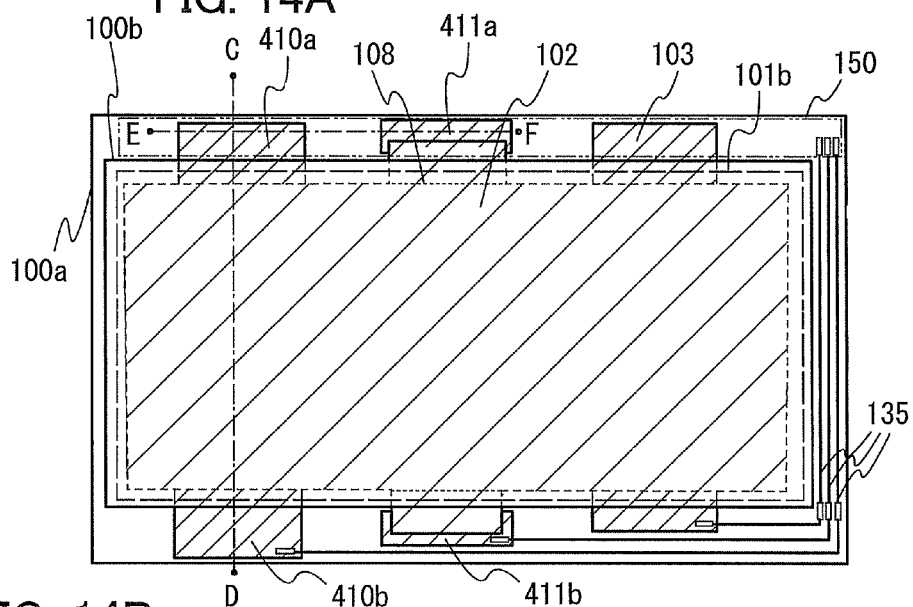
FIGS. 14A to 14C illustrate a light-emitting device according to one embodiment of the present invention.
Figure 14B:
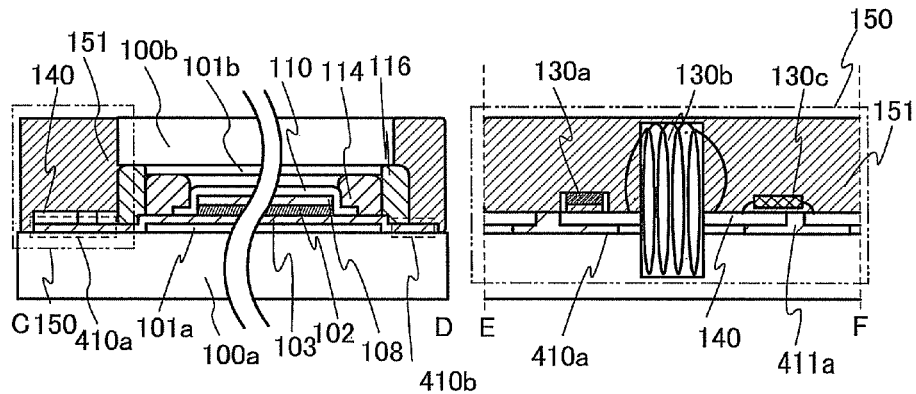

FIG. 14B is a cross-sectional view taken along lines C-D and E-F of a light-emitting device illustrated in FIG. 14A. Note that some components illustrated in FIG. 14B are not illustrated in FIG. 14A.

The light-emitting device described in this embodiment includes the first organic resin layer 100a, the first glass layer 101a, the light-emitting element (the first electrode 103, the EL layer 102, and the second electrode 108), the sealing layer 110, the second glass layer 101b, the second organic resin layer 100b, and a converter 150.

In FIG. 14A, the first electrode 103 is electrically connected to the converter 150. The second electrode 108 is electrically connected to connection electrodes 411a and 411b. The connection electrode 411a is electrically connected to the converter 150. The connection electrode 411b is electrically connected to the converter 150 through connection wirings 135.

In the cross section taken along line C-D in FIG. 14B, the first glass layer 101a is formed over the first organic resin layer 100a, and the first electrode 103 is provided so as to cover an end portion of the first glass layer 101a.

The sealant 114 is provided between the first electrode 103 and the second glass layer 101b. The sealant 116 is provided between the first electrode 103 and the second organic resin layer 100b.

Note that an extraction electrode 410a corresponds to a portion in the first electrode 103 that is connected to the converter 150. Further, an extraction electrode 410b corresponds to a portion in the first electrode 103 that is connected to the connection wiring 135.

In FIG. 14B, the connection electrodes 411a and 411b are provided on the same plane as the extraction electrodes 410a and 410b. The converter 150 is provided over the extraction electrode 410a and the connection electrode 411a, and the extraction electrode 410b and the connection electrode 411b are electrically connected to the converter 150 through the connection wirings 135. Therefore, the first electrode 103 and the second electrode 108 are electrically connected to the converter 150, and a current which is suitable for the specifications and is obtained by conversion by the converter 150 is input to the light-emitting element. Since a current is input to the light-emitting element from both ends in a distributed manner, unevenness in luminance can be reduced and a load can be prevented from being intensively applied to part of the light-emitting element.

As the connection wirings 135, a metal wiring or the like can be used. Alternatively, a printed wiring board may be used.

In FIG. 14A, the connection wirings 135 are positioned over a non-light-emitting region of the light-emitting device, and electrically connect the extraction electrode 410b or the connection electrode 411b and the converter 150 to each other. The arrangement of the connection wirings is not limited to this structure, but it is preferable to arrange the connection wirings so that the light extraction efficiency of the light-emitting device is not decreased. For example, in a light-emitting device having a structure in which light is extracted from one side, connection wirings can be positioned over a substrate through which light is not transmitted. Connection wirings and a converter can be provided outside a light-emitting device; however, they are preferably provided in a non-light-emitting region of the light-emitting device as described in this embodiment because the non-light-emitting region over the first organic resin layer 100a can be effectively utilized.

The connection wirings 135 and the converter 150 are buried and sealed under a sealing resin 151. As the sealing resin 151, an epoxy resin, an acrylic resin, a silicone resin, a phenol resin, or the like can be used.

The converter 150 is a DC-DC converter. As illustrated in the cross section taken along line E-F in FIG. 14B, the converter 150 includes a printed board 140, a first circuit element 130a, a second circuit element 130b, and a third circuit element 130c.

In the printed board 140, an opening which penetrates to reach the lower surface from the upper surface is provided. The opening is filled with a conductive material such as a silver paste or a solder by a plating method or the like, whereby the light-emitting element and the converter 150 can be electrically connected to each other.

In order to form the opening penetrating the printed board 140, a mechanical drilling method using an endmill, a punch press, sand blasting, or the like, a chemical milling method such as etching, laser milling, a method combining them, or the like can be used.

In this embodiment, the printed board 140 is a printed board in which a conductive material is applied to one surface of an insulating base material. With the use of the printed board, an insulating property of the connection interface between the printed board and the extraction electrode and an insulating property of the connection interface between the printed board and the connection electrode are ensured, whereby position adjustment at the time of arranging the printed board over the extraction electrode and the connection electrode can be easily performed. For the printed board 140, a flexible printed circuit (FPC) which has flexibility or a semi-flexible printed circuit part of which has flexibility may be used. With the use of a printed board having flexibility, a converter can be incorporated in a light-emitting device having flexibility or a light-emitting device with a curved surface.

The first circuit element 130a, the second circuit element 130b, and the third circuit element 130c are provided on the printed board 140. The first circuit element 130a, the second circuit element 130b, and the third circuit element 130c are electrically connected to each other on the printed board, and are included in a DC-DC converter circuit. Examples of the first circuit element 130a, the second circuit element 130b, and the third circuit element 130c include a switch, a transistor, a capacitor, a diode, an inductor, and a semiconductor chip. The first circuit element 130a, the second circuit element 130b, and the third circuit element 130c are included in a circuit functioning as a DC-DC converter, and a specific circuit configuration thereof is not described. Further, it is also possible to employ a structure in which some components included in the converter are provided on the printed board 140 and the other components are connected to those components from the outside.

The first circuit element 130a, the second circuit element 130b, and the third circuit element 130c are electrically connected to the extraction electrode 410a and the connection electrode 411a through an opening provided in the printed board 140. Therefore, a voltage suitable for the specifications is input to the light-emitting element by the converter 150. At the other end of the light-emitting element, the converter 150 and the light-emitting element are electrically connected to each other through the connection wirings 135.

In order to provide the converter 150 over the extraction electrode 410a and the connection electrode 411a, the printed board 140 on which the first circuit element 130a, the second circuit element 130b, and the third circuit element 130c have been formed in advance may be provided on the extraction electrode 410a and the connection electrode 411a with the use of an adhesive or the like, or the extraction electrode 410a and the connection electrode 411a may be connected to the printed board 140 with the use of a conductive material which is injected into the opening in the printed board 140.

Note that at the time of providing the converter 150 over the extraction electrode 410a and the connection electrode 411a, a circuit element which is included in the converter 150 may be embedded in the first organic resin layer 100a in order not to increase the thickness of the light-emitting device.

For example, the second circuit element 130b in FIG. 14B is provided so as to be embedded in an opening provided in the printed board 140 and the first organic resin layer 100a.

Figure 14C:
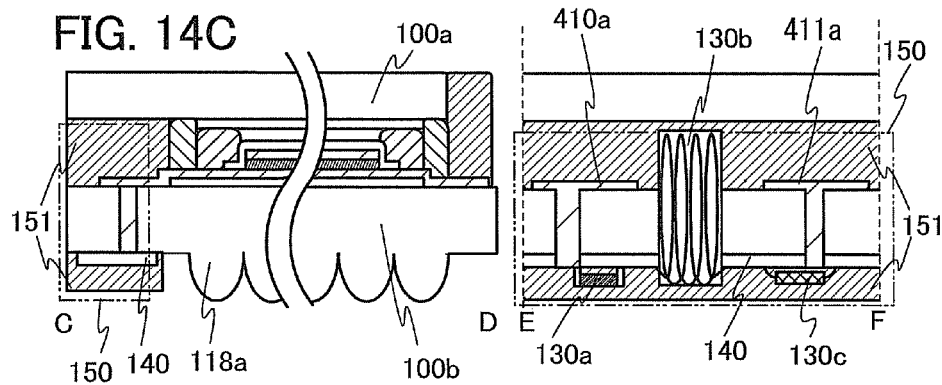

Further, in the case where the uneven structure 118a is provided in a light-emitting region of the light-emitting device as illustrated in FIG. 14C, it is possible to employ a structure in which the second circuit element 130b penetrates the first organic resin layer 100a through an opening in the first organic resin layer 100a.

With such structures, even though a light-emitting device includes a converter, the thickness of the light-emitting device can be equivalent to that of a light-emitting device without a converter.

The opening in which the second circuit element 130b is embedded is provided in a region which is over the first organic resin layer 100a and in which neither the extraction electrode nor the connection electrode is provided. The width and height of the opening are adjusted as appropriate in order that the second circuit element 130b is embedded in the opening. The openings may be provided in the first organic resin layer 100a and the printed board 140 through different steps. Alternatively, after the printed board 140 is disposed on the first organic resin layer 100a, the opening may be formed in the first organic resin layer 100a and the printed board 140 through one step.

In order to form the opening in the first organic resin layer 100a, a mechanical drilling method using an endmill, sandblasting, or the like, a chemical milling method such as etching, laser milling, or a method combining them can be used.

Further, in the case where the first organic resin layer 100a provided with the uneven structure 118a is used as illustrated in FIG. 14C, part of an organic resin material used for the first organic resin layer 100a is processed; thus, the uneven structure 118a can be provided. At this time, an opening may be formed through the step of processing part of the organic resin material.

The openings in which the extraction electrode 410a and the connection electrode 411a are embedded are preferably formed through the step of forming the opening in the printed board 140, because the number of manufacturing steps can be decreased.

A structure in which the converter is incorporated in the light-emitting device is employed in the above manner; thus, a malfunction in which an overcurrent flows through the light-emitting element can be prevented, because the converter has a function of supplying a stable current suitable for an element even when an input voltage is changed.

Note that the converter included in the light-emitting device described in this embodiment is not limited to a DC-DC converter. An AC-DC converter which converts an alternating-current voltage into a direct-current voltage may also be used. With the use of an AC-DC converter, alternating-current power can be directly applied to be used.

Note that the light-emitting device of this embodiment has a structure in which one light-emitting element is electically connected to one converter; however, the present invention is not limited to this structure. In the case where a light-emitting device includes a plurality of light-emitting elements, it is possible to employ a structure in which a plurality of light-emitting elements is electrically connected to one converter as well as a structure in which the number of converters is the same as that of light-emitting elements.

A light-emitting device having a bottom emission structure is described in this embodiment; however, this embodiment can be applied to any of the structures of the light-emitting devices described in other embodiments.

According to one embodiment of the present invention, a converter is incorporated in a light-emitting device, and thus the light-emitting device can be used without externally providing a converter. Therefore, the application range of the light-emitting device is expanded.

Further, a converter and a connection wiring are provided over a non-light-emitting region of the light-emitting device, whereby a space can be effectively utilized.

As described above, in the light-emitting device described in this embodiment, as a supporting substrate and a sealing substrate for the light-emitting element, the substrate in which the organic resin layer and the glass layer are attached to each other is used. Consequently, the light-emitting device can be reduced in weight. Further, entry of moisture, an impurity, or the like into an organic compound or a metal material included in the light-emitting element from the outside of the light-emitting device can be suppressed.

This embodiment can be freely combined with any of the other embodiments.

Embodiment 8

In this embodiment, one example of an EL layer that can be applied to one embodiment of the present invention will be described with reference to FIGS. 15A to 15C.

Figure 15A:
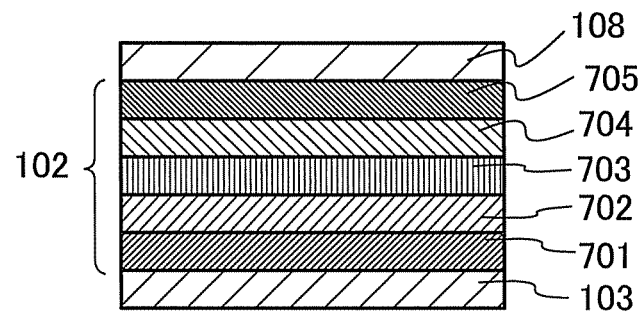
FIGS. 15A to 15C each illustrate an EL layer applicable to one embodiment of the present invention.

The EL layer 102 illustrated in FIG. 15A is provided between the first electrode 103 and the second electrode 108. The first electrode 103 and the second electrode 108 can have structures similar to those in Embodiment 1.

In this embodiment, in the EL layer 102, a hole-injection layer 701, a hole-transport layer 702, a layer 703 containing a light-emitting organic compound, an electron-transport layer 704, and an electron-injection layer 705 are stacked in this order from the first electrode 103 side.

A manufacturing method of a light-emitting element illustrated in FIG. 15A will be described.

The hole-injection layer 701 is a layer containing a substance having an excellent hole-injection property. As the substance having an excellent hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

The following aromatic amine compounds which are low molecular organic compounds can be used: 4,4',4''-tris(N, N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Alternatively, high molecular compounds (such as an oligomer, a dendrimer, or a polymer) can be used. As examples of the high molecular compound, the following are given: poly(N-vinylcarbazole) (abbreviation: PVK), poly(4-vinyltriphenylamine) (abbreviation: PVTPA), poly [N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyebenzidine](abbreviation: Poly-TPD). A high molecular compound to which acid is added, such as poly (3,4-ethylenedioxythiophene)/poly(styrenesulfonic acid) (PEDOT/PSS), or polyaniline/poly(styrenesulfonic acid) (PAni/PSS), can also be used.

In particular, for the hole-injection layer 701, a composite material in which an acceptor substance is added to an organic compound having an excellent hole-transport property is preferably used. With the use of the composite material in which an acceptor substance is added to a substance having an excellent hole-transport property, excellent hole injection from the first electrode 103 can be obtained, which results in a reduction in drive voltage of the light-emitting element. Such a composite material can be formed by co-depositing a substance having an excellent hole-transport property and an acceptor substance. The hole-injection layer 701 is formed using the composite material, whereby excellent hole injection from the first electrode 103 into the EL layer 102 can be obtained.

As the organic compound for the composite material, any of a variety of compounds such as aromatic amine compounds, carbazole derivatives, aromatic hydrocarbons, and high molecular compounds (e.g., an oligomer, a dendrimer, and a polymer) can be used. The organic compound used for the composite material is preferably an organic compound having an excellent hole-transport property. Specifically, a substance having a hole mobility of $10^{-6}$ $cm^2/Vs$ or higher is preferably used. Note that any other substances may also be used as long as the hole-transport property thereof is higher than the electron-transport property thereof. The organic compounds that can be used for the composite material will be specifically given below.

Examples of the organic compounds that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N-diphenyl-[1,1'-biphenyl]-4, 4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Alternatively, any of the following aromatic hydrocarbon compounds can be used: 2-tert-butyl-9,10-di(2-naphthyl) anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Further alternatively, any of the following aromatic hydrocarbon compounds can be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

As examples of the electron acceptor, organic compounds such as 7,7,8,8-tetracyano-2,3,5,6-tetrafluoroquinodimethane (abbreviation: $F_4$-TCNQ) and chloranil, and transition metal oxides can be given. Oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is particularly preferable because it is stable in the air, has a low hygroscopic property, and is easily handled.

Note that the composite material may be formed using the above-described electron acceptor and the above-described high molecular compound such as PVK, PVTPA, PTPDMA, and Poly-TPD and may be used for the hole-injection layer 701.

The hole-transport layer 702 is a layer containing a substance having an excellent hole-transport property. As the substance having an excellent hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substances may also be used as long as the hole-transport property thereof is higher than the electron-transport property thereof. Note that the layer containing a substance having an excellent hole-transport property is not limited to a single layer and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can also be used.

As the layer 703 containing a light-emitting organic compound, for example, a fluorescent compound which exhibits fluorescence or a phosphorescent compound which exhibits phosphorescence can be used.

As the fluorescent compound that can be used for the layer 703 containing a light-emitting organic compound, a material for blue light emission, a material for green light emission, a material for yellow light emission, and a material for red light emission are given. As examples of the material for blue light emission, the following are given: N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. As examples of the material for green light emission, the following are given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N,N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. As examples of the material for yellow light emission, rubrene, 5,12-bis(1,1'-biphenyl-4-yl)-6,11-diphenyltetracene (abbreviation: BPT), and the like are given. As examples of the material for red light emission, N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like are given.

As the phosphorescent compound that can be used for the layer 703 containing a light-emitting organic compound, a material for blue light emission, a material for green light emission, a material for yellow light emission, a material for orange light emission, and a material for red light emission are given. As examples of the material for blue light emission, the following are given: bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium (III) picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), and the like. As examples of the material for green light emission, the following are given: tris(2-phenylpyridinato-N,C$^{2'}$)iridium(III) (abbreviation: Ir(ppy)$_3$), bis[2-phenylpyridinato-N,C$^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. As examples of the material for yellow light emission, the following are given: bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis (2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis 2-(4-methoxyphenyl)-3,5-dimethylpyrazinato indium(III) (abbreviation: Ir(dmmoppr)$_2$(acac)), and the like. As examples of the material for orange light emission, the following are given: tris(2-phenylquinolinato-N,C$^{2'}$)iridium (III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato) iridium(III) (abbreviation Ir(mppr-Me)$_2$(acac)), (acetylacetonato)bis(5-isopropyl-3-methyl-2-phenylpyrazinato) iridium(III) (abbreviation: Ir(mppr-iPr)$_2$(acac)), and the like. As examples of the material for red light emission, the following organometallic complexes are given: bis[2-(2'-benzo[4,5-a]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$ (acac)), (acetylac etonato)bis(2,3,5-triphenylpyrazinato) iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and (2,3,7,8,12,13,17,18-octaethyl-21H,23H-porphyrin)platinum(II) (abbreviation: PtOEP). In addition, rare earth metal complexes, such as tris(acetylacetonato) (monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare earth metal ions (electron transition between different multiplicities), and thus can be used as phosphorescent compounds.

Note that the layer 703 containing a light-emitting organic compound may have a structure in which the above light-emitting organic compound (a guest material) is dispersed in another substance (a host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

As specific examples of the host material, the following are given: metal complexes such as tris(8-quinolinolato) aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1, 3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthy)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl) phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

Plural kinds of materials can be used as the host material. For example, in order to suppress crystallization, a substance such as rubrene which suppresses crystallization may be further added. In addition, NPB, Alq, or the like may be further added in order to efficiently transfer energy to the guest material.

When the structure in which a guest material is dispersed in a host material is employed, crystallization of the layer 703 containing a light-emitting organic compound can be suppressed. In addition, concentration quenching due to high concentration of the guest material can be suppressed.

For the 703 containing a light-emitting organic compound, a high molecular compound can be used. Specifically, a material for blue light emission, a material for green light emission, and a material for orange to red light emission are given. As examples of the material for blue light emission, the following are given: poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. As examples of the material for green light emission, the following are given: poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], and the like. As examples of the material for orange to red light emission, the following are given: poly[2-methoxy-5-(2'-ethylhexoxy)-1,4-phenylenevinylene] (abbreviation: MEH-PPV), poly(3-butylthiophone-2,5-diyl) (abbreviation: R4-PAT), poly{[9,9-dihexyl-2,7-bis (1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of layers each containing a light-emitting organic compound and making emission colors of the layers different, light emission having a desired color can be obtained from the light-emitting element as a whole. For example, in a light-emitting element having two layers each containing a light-emitting organic compound, when the emission color of a first layer containing a light-emitting organic compound and the emission color of a second layer containing a light-emitting organic compound are made to be complementary colors, it is possible to obtain a light-emitting element from which white light is emitted from the whole light-emitting element. Note that "complementary colors" refer to colors that can produce an achromatic color when mixed. That is, emission of white light can be obtained by mixture of light emitted from substances whose emission colors are complementary colors: This can be applied to a light-emitting element having three or more layers each containing a light-emitting organic compound.

The electron-transport layer 704 is a layer containing a substance having an excellent electron-transport property. As examples of the substance having an excellent electron-transport property, the following are given: metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato) (4-phenylphenolato)aluminum (abbreviation: BAlq). A metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can also be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances given here are mainly ones that have an electron mobility of $10^{-6}$ cm$^2$/Vs or higher. Note that the electron-transport layer is not limited to a single layer and may be a stack of two or more layers containing any of the above substances.

The electron-injection layer 705 is a layer containing a substance having an excellent electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an inkjet method, or a coating method.

Figure 15B:
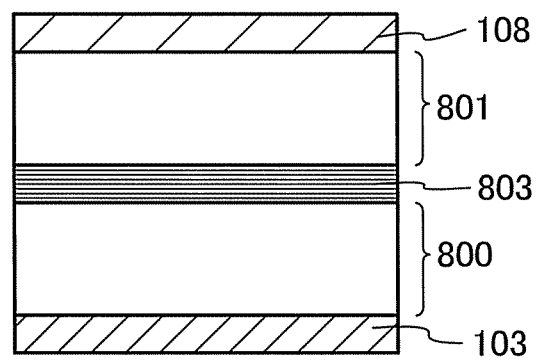

Note that a plurality of EL layers 102 may be stacked between the first electrode 103 and the second electrode 108 as illustrated in FIG. 15B. In that case, a charge generation layer 803 is preferably provided between a first EL layer 800 and a second EL layer 801 which are stacked. The charge generation layer 803 can be formed using the above composite material. Further, the charge generation layer 803 may have a stacked structure including a layer containing the composite material and a layer containing another material. In that case, as the layer containing another material, a layer containing an electron donating substance and a substance having an excellent electron-transport property, a layer formed of a transparent conductive film, or the like can be used. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. Note that this structure can be combined with any of the above structures of the EL layer.

Further, by forming EL layers to emit light of different colors from each other, a light-emitting element as a whole can provide light emission of a desired color. For example, in a light-emitting element having two EL layers, the emission colors of first and second EL layers are complementary, so that the light-emitting element can be made to emit white light as a whole. This can be applied to a light-emitting element having three or more EL layers.

Figure 15C:
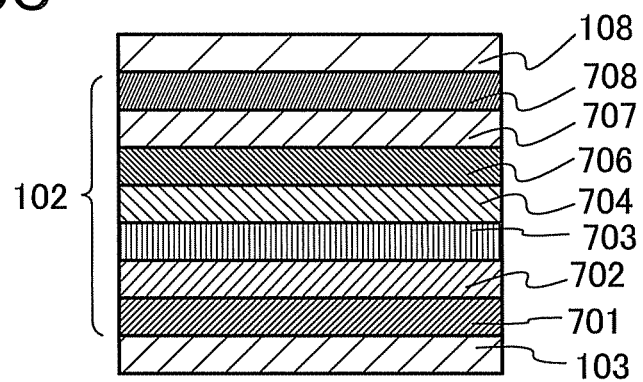

As illustrated in FIG. 15C, the EL layer 102 may include, between the first electrode 103 and the second electrode 108, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 108.

The composite material layer 708 which is in contact with the second electrode 108 is preferably provided, in which case damage caused to the EL layer 102 particularly when the second electrode 108 is formed by a sputtering method can be reduced. The composite material layer 708 can be formed using the above composite material in which an acceptor substance is contained in an organic compound having an excellent hole-transport property.

Further, by providing the electron-injection buffer layer 706, an injection barrier between the composite material layer 708 and the electron-transport layer 704 can be reduced; thus, electrons generated in the composite material layer 708 can be easily injected into the electron-transport layer 704.

A substance having an excellent electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, or a carbonate such as lithium carbonate or cesium carbonate), an alkaline earth metal compound (e.g., an oxide, a halide, or a carbonate), or a rare earth metal compound (e.g., an oxide, a halide, or a carbonate) can be used.

Further, in the case where the electron-injection buffer layer 706 contains a substance having an excellent electron-transport property and a donor substance, the donor substance is preferably added so that the mass ratio of the donor substance to the substance having an excellent electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate). Note that as the substance having an excellent electron-transport property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having an excellent electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in drive voltage can be suppressed.

The electron-relay layer 707 contains a substance having an excellent electron-transport property and is formed so that the LUMO level of the substance having an excellent electron-transport property is located between the LUMO level of the acceptor substance contained in the composite material layer 708 and the LUMO level of the substance having an excellent electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having an excellent electron-transport property contained in the electron-transport layer 704. As a specific value of the energy level, the LUMO level of the substance having an excellent electron-transport property contained in the electron-relay layer 707 is preferably greater than or equal to −5.0 eV, more preferably greater than or equal to −5.0 eV and less than or equal to −3.0 eV.

As the substance having an excellent electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, specifically, any of CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc) is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having a metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent, and thus has an advantage of being easily handled during formation of a light-emitting element and an advantage of facilitating maintenance of an apparatus used for film formation.

The electron-relay layer 707 may further contain a donor substance. As the donor substance, any of the following can be used: an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having an excellent electron-transport property, a substance having a LUMO level greater than the acceptor level of the acceptor substance contained in the composite material layer 708 can be used. As a specific value of the energy level, the LUMO level is greater than or equal to −5.0 eV, preferably greater than or equal to −5.0 eV and less than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 707 because of its stability.

As specific examples of the perylene derivative, the following are given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following are given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having an excellent electron-transport property and the donor substance.

The hole-injection layer 701, the hole-transport layer 702, the layer 703 containing a light-emitting organic compound, and the electron-transport layer 704 may be each formed using any of the above-described materials.

In the above manner, the EL layer 102 of this embodiment can be manufactured.

This embodiment can be freely combined with any of the other embodiments.

Embodiment 9

In this embodiment, examples of a lighting device including a light-emitting device according to one embodiment of the present invention will be described with reference to FIGS. 21A and 21B.

According to one embodiment of the present invention, a lighting device in which a light-emitting portion has a curved surface can be realized.

Further, according to one embodiment of the present invention, a lighting device having a see-through light-emitting portion can be realized.

One embodiment of the present invention can also be applied to lighting in a car; for example, lighting can be provided for a dashboard, on a windshield, ceiling, or the like.

Figure 21A:
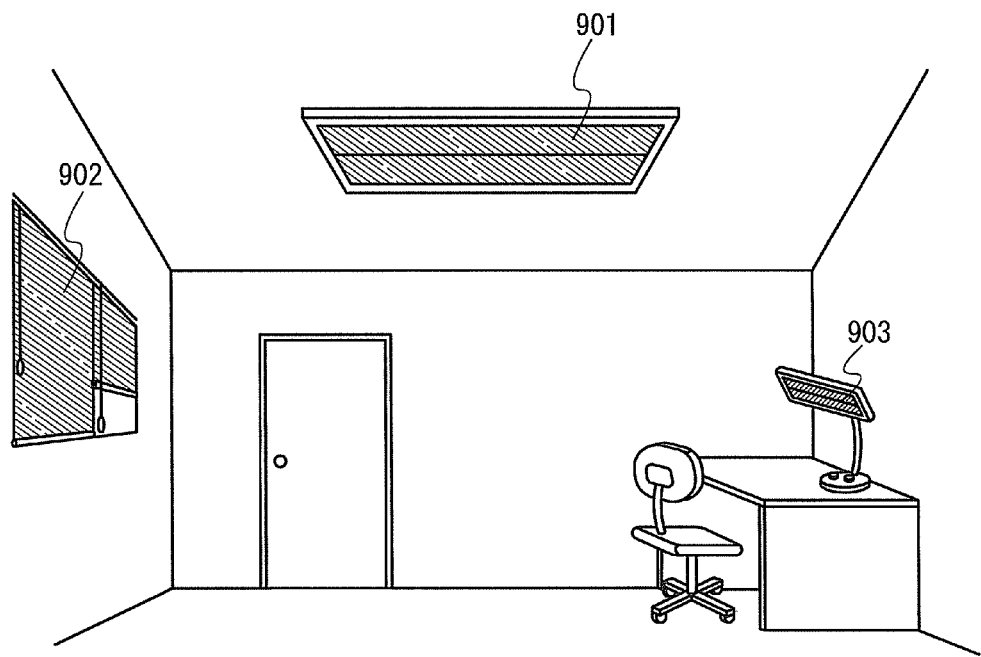
FIGS. 21A and 21B illustrate lighting devices according to one embodiment of the present invention.

FIG. 21A illustrates an interior lighting device 901 and a desk lamp 903 to Which one embodiment of the present invention is applied. Since the area of the light-emitting device can be increased, the light-emitting device can be used as a lighting device with a large area. Furthermore, the light-emitting device can be used as a roll-type lighting device 902.

Figure 21B:
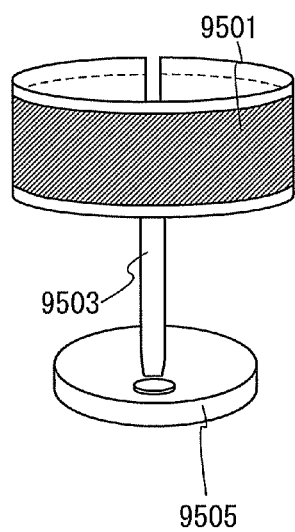

FIG. 21B illustrates another example of a lighting device. A desk lamp illustrated in FIG. 21B includes a lighting portion 9501, a support 9503, a support base 9505, and the like. The lighting portion 9501 includes a light-emitting device according to one embodiment of the present invention. According to one embodiment of the present invention, a lighting device having a curved surface or a lighting device including a flexible lighting portion can be realized in this manner. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be freely combined with any of the other embodiments.

Example 1

In this example, an example of a film containing gallium (Ga), zinc (Zn), and oxygen (O) (hereinafter referred to as a GZO film), which can be applied to one embodiment of the present invention, will be described with reference to FIG. 16 and FIG. 17.

<<Manufacture of Sample>>

First, GZO films manufactured in this example will be described. Three kinds of GZO films shown in Table 1 were manufactured in this example.

TABLE 1

|  | $Ga_2O_3$:ZnO (molar ratio) |
| --- | --- |
| Structural Example 1 | 1:5 |
| Structural Example 2 | 1:1 |
| Structural Example 3 | 5:1 |

In manufacture of all the structural examples according to this example, the film was formed by a sputtering method under the following condition: the distance between a substrate and a target was 110 mm, the pressure was 0.8 Pa, the direct current (DC) power was 200 W, the atmosphere was an oxygen atmosphere, and the substrate heating temperature was 200° C.

As Structural Example 1, a GZO film with a thickness of 100 nm was formed with the use of a Ga—Zn—O-based metal oxide target ($Ga_2O_3$:ZnO=1:5 [molar ratio]).

As Structural Example 2, a GZO film with a thickness of 100 nm was formed with the use of a Ga—Zn—O-based metal oxide target ($Ga_2O_3$:ZnO=1:1 [molar ratio]).

As Structural Example 3, a GZO film with a thickness of 100 nm was formed with the use of a Ga—Zn—O-based metal oxide target ($Ga_2O_3$:ZnO=5:1 [molar ratio]).

<<Measurement of Refractive Index>>

The refractive indexes of Structural Examples 1 to 3 were measured. In this example, the refractive indexes were measured by an ellipsometry method.

Figure 16:
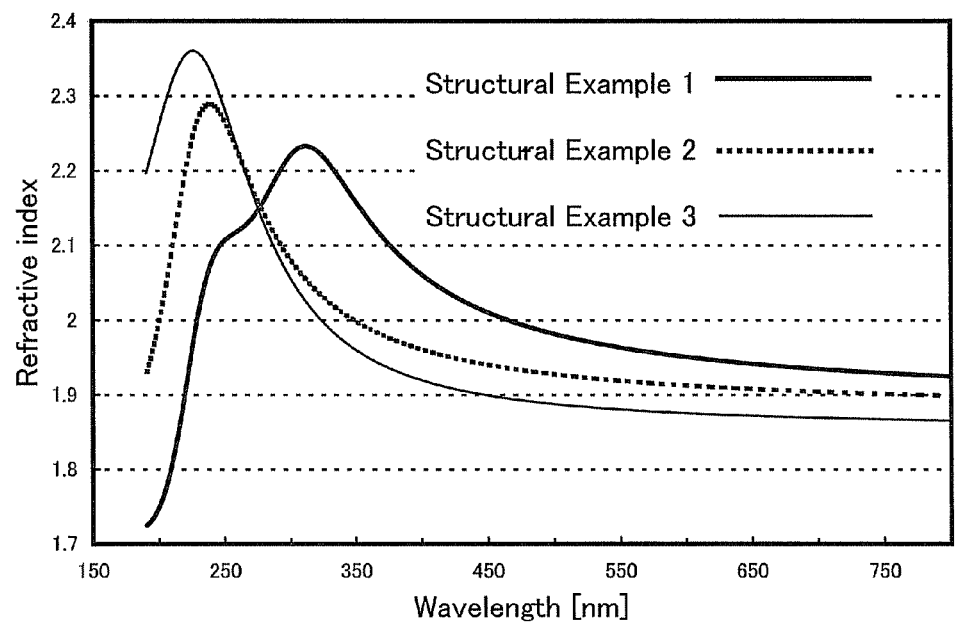
FIG. 16 shows measurement results of refractive indexes in Example 1.

FIG. 16 shows the refractive indexes of Structural Examples 1 to 3. In FIG. 16, the horizontal axis indicates a wavelength (nm) and the vertical axis indicates a refractive index.

The refractive indexes of Structural Examples 1 to 3 hardly depend on the wavelength in a region (hereinafter referred to as a visible light region) where the wavelength is longer than or equal to 400 nm and shorter than or equal to 800 nm.

As can be seen from FIG. 16, in the visible light region, the refractive index of Structural Example 1 (formed using a target in which the percentage of ZnO is high) is higher than the refractive index of Structural Example 3 (formed using a target in which the percentage of $Ga_2O_3$ is high).

The above result indicates that varying the percentages of $Ga_2O_3$ and ZnO contained in the Ga—Zn—O-based metal oxide target causes variation in refractive index of the obtained GZO film.

<<Measurement of Transmissivity>>

Then, the transmissivities of Structural Examples 1 to 3 were measured. In this example, the transmissivities were measured by using a spectrophotometer.

Figure 17:
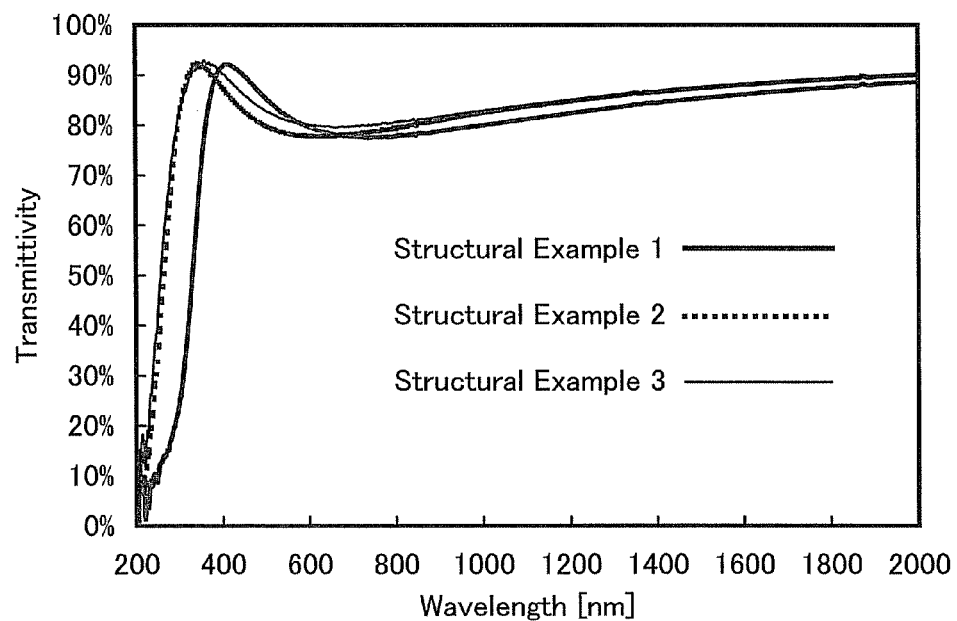
FIG. 17 shows measurement results of transmissivities in Example 1.

FIG. 17 shows the transmissivities of Structural Examples 1 to 3. In FIG. 17, the horizontal axis indicates a wavelength (nm) and the vertical axis indicates a transmissivity.

The transmissivities of Structural Examples 1 to 3 were as high as 75% or higher in a region where the wavelength is longer than or equal to 400 nm.

The above result shows that the GZO films have an excellent property of transmitting visible light.

As is clear from this example, a film containing Ga, Zn, and O has an excellent property of transmitting visible light. Further, by varying the percentages of Ga and Zn, the refractive index of the obtained film is greatly varied. Therefore, the film containing Ga, Zn, and O can be preferably used as a functional layer according to one embodiment of the present invention.

Example 2

Figure 19:
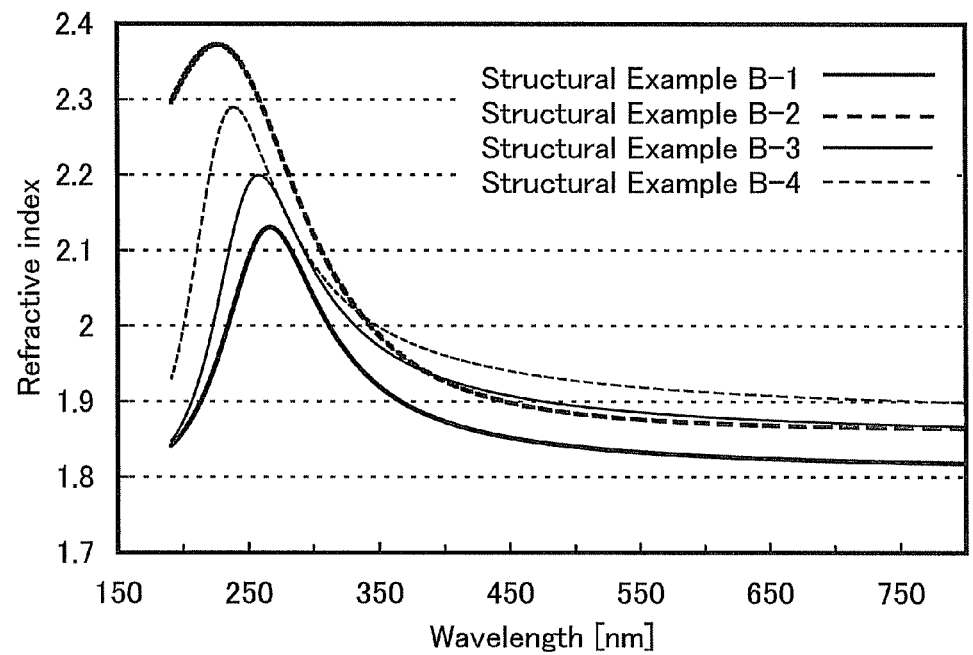
FIG. 19 shows measurement results of refractive indexes in Example 2.
Figure 20:
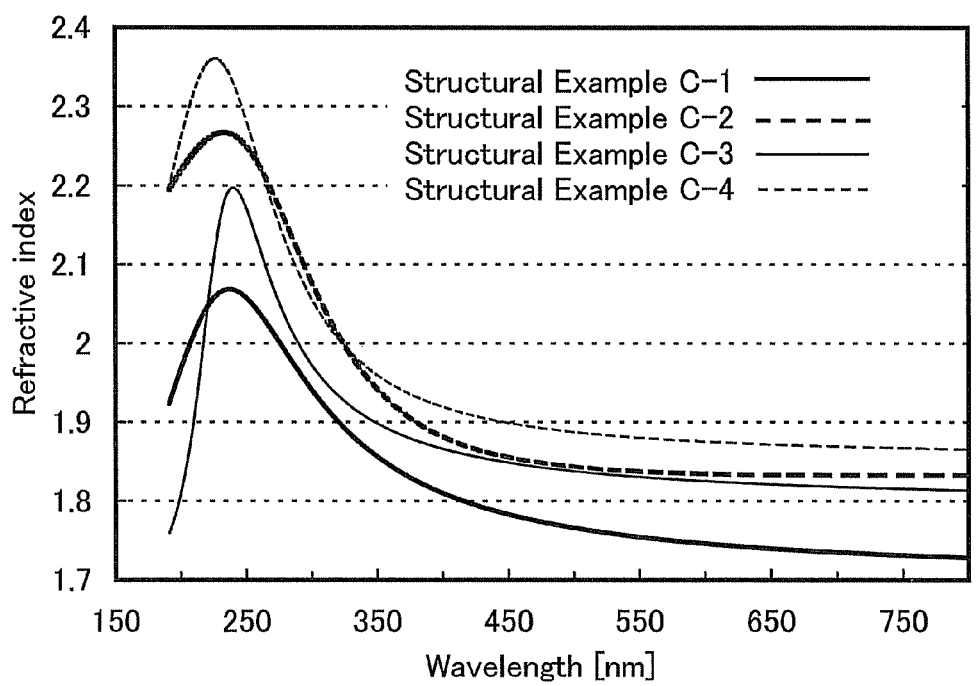
FIG. 20 shows measurement results of refractive indexes in Example 2.

In this example, another example of a film containing Ga, Zn, and O (hereinafter referred to as a GZO film), which can be applied to one embodiment of the present invention, will be described with reference to FIG. 18, FIG. 19, and FIG. 20.

<<Manufacture of Sample>>

First, GZO films manufactured in this example will be described. In this example, 12 kinds of GZO films shown in Table 2 were manufactured.

TABLE 2

|  | $Ga_2O_3$:ZnO (molar ratio) | Deposition Atmosphere | Heat Treatment for Substrate | Thickness (nm) |
| --- | --- | --- | --- | --- |
| Structural Example A-1 | 1:5 | Mixed atmosphere of argon and oxygen | Not performed | 250 |
| Structural Example A-2 | 1:5 | Oxygen atmosphere | Not performed | 90 |
| Structural Example A-3 | 1:5 | Mixed atmosphere of argon and oxygen | Performed | 200 |
| Structural Example A-4 | 1:5 | Oxygen atmosphere | Performed | 150 |
| Structural Example B-1 | 1:1 | Mixed atmosphere of argon and oxygen | Not performed | 180 |
| Structural Example B-2 | 1:1 | Oxygen atmosphere | Not performed | 50 |
| Structural Example B-3 | 1:1 | Mixed atmosphere of argon and oxygen | Performed | 150 |
| Structural Example B-4 | 1:1 | Oxygen atmosphere | Performed | 90 |
| Structural Example C-1 | 5:1 | Mixed atmosphere of argon and oxygen | Not performed | 160 |

TABLE 2-continued

| | Ga$_2$O$_3$:ZnO (molar ratio) | Deposition Atmosphere | Heat Treatment for Substrate | Thickness (nm) |
|---|---|---|---|---|
| Structural Example C-2 | 5:1 | Oxygen atmosphere | Not performed | 50 |
| Structural Example C-3 | 5:1 | Mixed atmosphere of argon and oxygen | Performed | 160 |
| Structural Example C-4 | 5:1 | Oxygen atmosphere | Performed | 90 |

In manufacture of all the structural examples according to this example, the film was formed by a sputtering method under the following condition: the distance between a substrate and a target was 110 mm, the pressure was 0.8 Pa, and the direct current (DC) power was 200 W.

As Structural Example A-1, a GZO film with a thickness of 250 nm was formed at room temperature with the use of a Ga—Zn—O-based metal oxide target (Ga$_2$O$_3$:ZnO=1:5 [molar ratio]) in a mixed atmosphere of argon and oxygen (the flow ratio was argon:oxygen=7:3).

As Structural Example A-2, a GZO film with a thickness of 90 nm was formed at room temperature with the use of a Ga—Zn—O-based metal oxide target (Ga$_2$O$_3$:ZnO=1:5 [molar ratio]) in an oxygen atmosphere.

As Structural Example A-3, a GZO film with a thickness of 200 nm was formed at a substrate heating temperature of 200° C. with the use of a Ga—Zn—O-based metal oxide target (Ga$_2$O$_3$:ZnO=1:5 [molar ratio]) in a mixed atmosphere of argon and oxygen (the flow ratio was argon:oxygen=7:3).

As Structural Example A-4, a GZO film with a thickness of 150 nm was formed at a substrate heating temperature of 200° C. with the use of a Ga—Zn—O-based metal oxide target (Ga$_2$O$_3$:ZnO=1:5 [molar ratio]) in an oxygen atmosphere.

As Structural Example B-1, a GZO film with a thickness of 180 nm was formed at room temperature with the use of a Ga—Zn—O-based metal oxide target (Ga$_2$O$_3$:ZnO=1:1 [molar ratio]) in a mixed atmosphere of argon and oxygen (the flow ratio was argon:oxygen=7:3).

As Structural Example B-2, a GZO film with a thickness of 50 nm was formed at room temperature with the use of a Ga—Zn—O-based metal oxide target (Ga$_2$O$_3$:ZnO=1:1 [molar ratio]) in an oxygen atmosphere.

As Structural Example B-3, a GZO film with a thickness of 150 nm was formed at a substrate heating temperature of 200° C. with the use of a Ga—Zn—O-based metal oxide target (Ga$_2$O$_3$:ZnO=1:1 [molar ratio]) in a mixed atmosphere of argon and oxygen (the flow ratio was argon:oxygen=7:3).

As Structural Example B-4, a GZO film with a thickness of 90 nm was formed at a substrate heating temperature of 200° C. with the use of a Ga—Zn—O-based metal oxide target (Ga$_2$O$_3$:ZnO=1:1 [molar ratio]) in an oxygen atmosphere.

As Structural Example C-1, a GZO film with a thickness of 160 nm was formed at room temperature with the use of a Ga—Zn—O-based metal oxide target (Ga$_2$O$_3$:ZnO=5:1 [molar ratio]) in a mixed atmosphere of argon and oxygen (the flow ratio was argon:oxygen=7:3).

As Structural Example C-2, a GZO film with a thickness of 50 nm was formed at room temperature with the use of a Ga—Zn—O-based metal oxide target (Ga$_2$O$_3$:ZnO=5:1 [molar ratio]) in an oxygen atmosphere.

As Structural Example C-3, a GZO film with a thickness of 160 nm was formed at a substrate heating temperature of 200° C. with the use of a Ga—Zn—O-based metal oxide target (Ga$_2$O$_3$:ZnO=5:1 [molar ratio]) in a mixed atmosphere of argon and oxygen (the flow ratio was argon:oxygen=7:3).

As Structural Example C-4, a GZO film with a thickness of 90 nm was formed at a substrate heating temperature of 200° C. with the use of a Ga—Zn—O-based metal oxide target (Ga$_2$O$_3$:ZnO=5:1 [molar ratio]) in an oxygen atmosphere.

<<Measurement of Refractive Index>>

Then, the refractive indexes of Structural Examples A-1 to A-4, Structural Examples B-1 to B-4, and Structural Examples C-1 to C-4 were measured.

The refractive indexes were measured by a method similar to that in Example 1.

Figure 18:
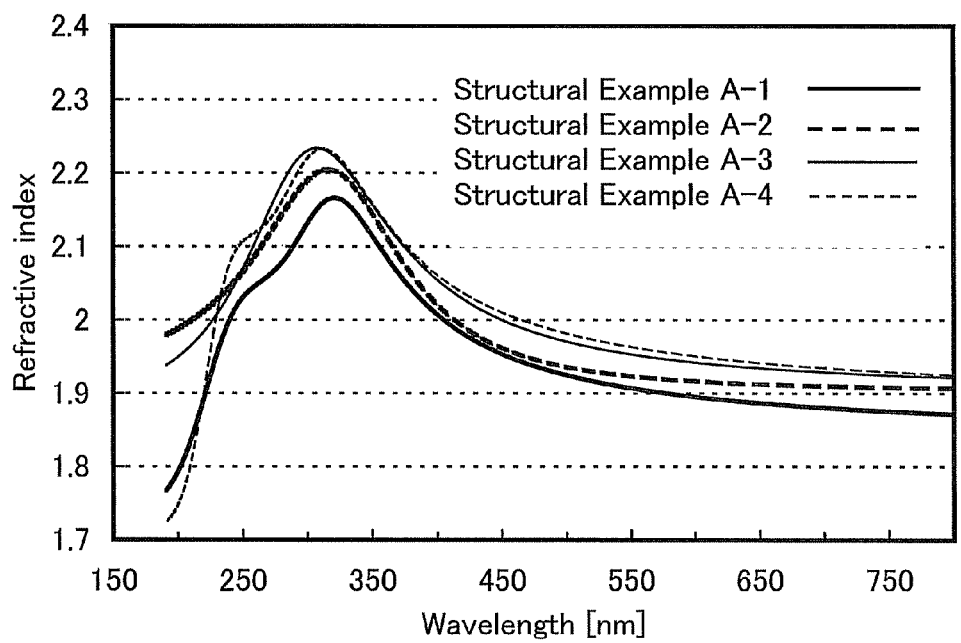
FIG. 18 shows measurement results of refractive indexes in Example 2.

FIG. 18 shows the refractive indexes of Structural Examples A-1 to A-4. FIG. 19 shows the refractive indexes of Structural Examples B-1 to B-4. FIG. 20 shows the refractive indexes of Structural Examples C-1 to C-4. In each of FIG. 18, FIG. 19, and FIG. 20, the horizontal axis indicates a wavelength (nm) and the vertical axis indicates a refractive index.

The refractive indexes of Structural Examples manufactured in this example hardly depend on the wavelength in the visible light region.

The results of this example show that, by varying the percentages of Ga and Zn or conditions such as an atmosphere for forming a film, the refractive index of the obtained GZO film is greatly varied. For example, a GZO film having a refractive index higher than or equal to 1.7 and lower than or equal to 2.0 in the visible light region can be formed.

This application is based on Japanese Patent Application serial no. 2010-280652 filed with Japan Patent Office on Dec. 16, 2010, the entire contents of which are hereby incorporated by reference.

What is claimed is:

1. A light-emitting device comprising:
    a first organic resin layer;
    a first glass layer on and in contact with the first organic resin layer;
    a light-emitting element over the first glass layer, the light-emitting element comprising an organic light-emitting layer interposed between a first electrode and a second electrode, the first electrode being over the first glass layer and the second electrode being over the organic light-emitting layer;
    a second glass layer over the light-emitting element;
    a second organic resin layer on and in contact with the second glass layer;
    an uneven structure body and a resin layer on and in contact with the uneven structure body, and
    a protective layer between the first electrode and the resin layer, and in contact with the resin layer,
    wherein the uneven structure body and the resin layer are interposed between the first electrode and the first glass layer,
    wherein the resin layer is interposed between the uneven structure body and the first electrode, and
    wherein a refractive index of the protective layer is higher than a refractive index of the resin layer.

2. The light-emitting device according to claim 1, further comprising:
    a sealing layer covering the light-emitting element, the sealing layer being in contact with the first glass layer.

3. The light-emitting device according to claim 1, further comprising:
an insulating film between the first glass layer and the light-emitting element, the insulating film comprising zinc, oxygen, and one of gallium and aluminum.

4. The light-emitting device according to claim 1,
wherein a thickness of the first glass layer and a thickness of the second glass layer are greater than or equal to 25 μm and less than or equal to 100 μm.

5. The light-emitting device according to claim 1,
wherein the first organic resin layer and the second organic resin layer are formed from a same material.

6. The light-emitting device according to claim 1,
wherein both of the first organic resin layer and the second organic resin layer, both of the first glass layer and the second glass layer and both of the first electrode and the second electrode have a property of transmitting visible light.

7. The light-emitting device according to claim 1, further comprising:
an uneven structure under the first organic resin layer.

8. A lighting device comprising the light-emitting device according to claim 1 in a light-emitting portion.

9. A light-emitting device comprising:
a first organic resin layer;
a first glass layer on and in contact with the first organic resin layer;
a light-emitting element over the first glass layer, the light-emitting element comprising an organic light-emitting layer interposed between a first electrode and a second electrode, the first electrode being over the first glass layer and the second electrode being over the organic light-emitting layer;
a second glass layer over the light-emitting element;
a second organic resin layer on and in contact with the second glass layer; and
a first sealant between and in contact with the first organic resin layer and the second organic resin layer,
wherein the first sealant is continuous from the first organic resin layer to the second organic resin layer.

10. The light-emitting device according to claim 9, further comprising:
a second sealant between and in contact with the first glass layer and the second glass layer.

11. The light-emitting device according to claim 10,
wherein the second sealant is continuous from the first glass layer to the second glass layer.

12. The light-emitting device according to claim 9, further comprising:
a sealing layer covering the light-emitting element, the sealing layer being in contact with the first glass layer.

13. The light-emitting device according to claim 9, further comprising:
an insulating film between the first glass layer and the light-emitting element, the insulating film comprising zinc, oxygen, and one of gallium and aluminum.

14. The light-emitting device according to claim 9,
wherein a thickness of the first glass layer and a thickness of the second glass layer are greater than or equal to 25 μm and less than or equal to 100 μm.

15. The light-emitting device according to claim 9,
wherein the first organic resin layer and the second organic resin layer are formed from a same material.

16. The light-emitting device according to claim 9,
wherein both of the first organic resin layer and the second organic resin layer, both of the first glass layer and the second glass layer and both of the first electrode and the second electrode have a property of transmitting visible light.

17. The light-emitting device according to claim 9, further comprising:
an uneven structure body and a resin layer on and in contact with the uneven structure body,
wherein the uneven structure body and the resin layer are interposed between the first electrode and the first glass layer,
wherein the resin layer is interposed between the uneven structure body and the first electrode.

18. The light-emitting device according to claim 17, further comprising:
a protective layer between the first electrode and the resin layer, and in contact with the resin layer,
wherein a refractive index of the protective layer is higher than a refractive index of the resin layer.

19. The light-emitting device according to claim 9, further comprising:
an uneven structure under the first organic resin layer.

20. A lighting device comprising the light-emitting device according to claim 9 in a light-emitting portion.

21. A light-emitting device comprising:
a first organic resin layer;
a first glass layer on and in contact with the first organic resin layer;
a light-emitting element over the first glass layer, the light-emitting element comprising an organic light-emitting layer interposed between a first electrode and a second electrode, the first electrode being over the first glass layer and the second electrode being over the organic light-emitting layer;
a second glass layer over the light-emitting element;
a second organic resin layer on and in contact with the second glass layer;
a converter over the first organic resin layer, the converter being electrically connected to the light-emitting element; and
an electrode between the first organic resin layer and the second organic resin layer,
wherein the converter overlaps and is in electrical contact with the electrode,
wherein a topmost portion of the converter is below a top surface of the second organic resin layer.

22. The light-emitting device according to claim 21,
wherein the converter comprises a circuit element embedded in the first organic resin layer.

23. The light-emitting device according to claim 21, further comprising:
a sealing layer covering the light-emitting element, the sealing layer being in contact with the first glass layer.

24. The light-emitting device according to claim 21, further comprising:
an insulating film between the first glass layer and the light-emitting element, the insulating film comprising zinc, oxygen, and one of gallium and aluminum.

25. The light-emitting device according to claim 21,
wherein a thickness of the first glass layer and a thickness of the second glass layer are greater than or equal to 25 μm and less than or equal to 100 μm.

26. The light-emitting device according to claim 21,
wherein the first organic resin layer and the second organic resin layer are formed from a same material.

27. The light-emitting device according to claim 21,
wherein both of the first organic resin layer and the second organic resin layer, both of the first glass layer and the second glass layer and both of the first electrode and the second electrode have a property of transmitting visible light.

28. The light-emitting device according to claim 21, further comprising:
an uneven structure body and a resin layer on and in contact with the uneven structure body,
wherein the uneven structure body and the resin layer are interposed between the first electrode and the first glass layer,
wherein the resin layer is interposed between the uneven structure body and the first electrode.

29. The light-emitting device according to claim 28, further comprising:
a protective layer between the first electrode and the resin layer, and in contact with the resin layer,
wherein a refractive index of the protective layer is higher than a refractive index of the resin layer.

30. The light-emitting device according to claim 21, further comprising:
an uneven structure under the first organic resin layer.

31. A lighting device comprising the light-emitting device according to claim 21 in a light-emitting portion.

* * * * *

UNITED STATES PATENT AND TRADEMARK OFFICE
CERTIFICATE OF CORRECTION

PATENT NO. : 9,502,690 B2
APPLICATION NO. : 13/327047
DATED : November 22, 2016
INVENTOR(S) : Shunpei Yamazaki et al.

It is certified that error appears in the above-identified patent and that said Letters Patent is hereby corrected as shown below:

In the Specification

Column 11, Line 1; Change "described Embodiment" to --described in Embodiment--.
Column 16, Line 55; Change "described Embodiment" to --described in Embodiment--.
Column 24, Line 60; Change "electically" to --electrically--.
Column 26, Line 7; Change "(phenyebenzidine]" to --(phenyl)benzidine]--.
Column 26, Line 45; Change "N,N-dipheny" to --N,N'-dipheny--.
Column 27, Line 60; Change "N,N-diphenylstil-" to --N,N'-diphenylstil- --.
Column 28, Line 5; Change "N,N,N'-triphenyl" to --N,N',N'-triphenyl--.
Column 28, Line 16; Change "d  iamine" to --diamine--.
Column 28, Line 48; Change "bis 2-(4-" to --bis{2-(4- --.
Column 28, Line 49; Change "indium(III)" to --}iridium(III)--.
Column 28, Line 56; Change "(abbreviation Ir" to --abbreviation: Ir--.
Column 28, Line 66; Change "(acetylac   etonato)" to --(acetylacetonato)--.
Column 29, Lines 44 to 45; Change "diphenyl-[4-(10-phenyl" to --diphenyl-9-[4-(10-phenyl--.
Column 29, Line 48; Change "naphthy)" to --naphthyl)--.
Column 30, Line 28; Change "butylthiophone-" to --butylthiophene- --.
Column 30, Line 50; Change "colors: This" to --colors. This--.
Column 35, Line 2; Change "Which" to --which--.

Signed and Sealed this
Sixth Day of June, 2017

Michelle K. Lee
*Director of the United States Patent and Trademark Office*